(12) United States Patent
Kimoto et al.

(10) Patent No.: US 11,302,655 B2
(45) Date of Patent: Apr. 12, 2022

(54) SEMICONDUCTOR DEVICE INCLUDING A SEMICONDUCTOR ELEMENT AND A LEAD FRAME WITH A PLURALITY OF HOLES

(71) Applicant: Mitsubishi Electric Corporation, Tokyo (JP)

(72) Inventors: Nobuyoshi Kimoto, Fukuoka (JP); Mitsunori Aiko, Tokyo (JP); Takaaki Shirasawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/051,085

(22) PCT Filed: Jun. 29, 2018

(86) PCT No.: PCT/JP2018/024821
§ 371 (c)(1),
(2) Date: Oct. 27, 2020

(87) PCT Pub. No.: WO2020/003495
PCT Pub. Date: Jan. 2, 2020

(65) Prior Publication Data
US 2021/0233869 A1    Jul. 29, 2021

(51) Int. Cl.
*H01L 23/48* (2006.01)
*H01L 23/52* (2006.01)
(Continued)

(52) U.S. Cl.
CPC ........ *H01L 23/562* (2013.01); *H01L 23/3107* (2013.01); *H01L 23/4951* (2013.01);
(Continued)

(58) Field of Classification Search
CPC ......... H01L 24/83; H01L 24/32; H01L 24/05; H01L 23/562; H01L 23/3107; H01L 23/4951; H01L 23/49568
See application file for complete search history.

(56) References Cited

U.S. PATENT DOCUMENTS

2008/0036078 A1*  2/2008  Herbsommer .... H01L 23/49524
                                                    257/727
2012/0068357 A1    3/2012  Saito et al.
(Continued)

FOREIGN PATENT DOCUMENTS

JP    2008182074 A    8/2008
JP    2009004435 A    1/2009
(Continued)

OTHER PUBLICATIONS

An Office Action; "Notice of Reasons for Refusal", mailed by the Japanese Patent Office on Apr. 13, 2021, which corresponds to Japanese Patent Application No. 2020-526853 and is related to U.S. Appl. No. 17/051,085; with English language translation.
(Continued)

*Primary Examiner* — Alonzo Chambliss
(74) *Attorney, Agent, or Firm* — Studebaker & Brackett PC

(57) ABSTRACT

A semiconductor device includes a semiconductor element having an electrode, material of which is first metal, a lead frame through which a plurality of holes extend with an outer contour of the electrode being avoided in a first portion, and having the first portion, material of which is second metal, a bonding layer interposed between the first portion and the electrode, and solder being inside the plurality of holes and adjoining the bonding layer, the solder being thicker than the bonding layer. The plurality of holes have a plurality of first holes extending through the first portion in a thickness direction of the first portion. The
(Continued)

bonding layer has a first bonding layer located on the electrode side and being an alloy of the first metal and tin, and a second bonding layer located on the first portion side and being an alloy of the second metal and tin. The plurality of first holes are located in an annular region inside the outer contour of the electrode.

10 Claims, 21 Drawing Sheets

(51) Int. Cl.
    *H01L 23/34*     (2006.01)
    *H01L 21/00*     (2006.01)
    *H05K 5/02*     (2006.01)
    *H01L 23/00*     (2006.01)
    *H01L 23/31*     (2006.01)
    *H01L 23/495*     (2006.01)

(52) U.S. Cl.
    CPC ........ *H01L 23/49568* (2013.01); *H01L 24/05* (2013.01); *H01L 24/32* (2013.01); *H01L 24/83* (2013.01)

(56) References Cited

U.S. PATENT DOCUMENTS

| | | |
|---|---|---|
| 2014/0035112 A1 | 2/2014 | Kadoguchi et al. |
| 2018/0197838 A1 | 7/2018 | Besshi et al. |

FOREIGN PATENT DOCUMENTS

| | | |
|---|---|---|
| JP | 2011204886 A | 10/2011 |
| JP | 2012069640 A | 4/2012 |
| JP | 2012212713 A | 11/2012 |
| JP | 2012235081 A | 11/2012 |
| JP | 2016167480 A | 9/2016 |
| WO | 2017073233 A1 | 5/2017 |

OTHER PUBLICATIONS

An Office Action; "Notice of Reasons for Refusal", mailed by the Japanese Patent Office on Feb. 2, 2021, which corresponds to Japanese Patent Application No. 2020-526853 and is related to U.S. Appl. No. 17/051,085; with English language translation.
International Search Report issued in PCT/JP2018/024821; dated Sep. 4, 2018.

* cited by examiner

F I G. 8
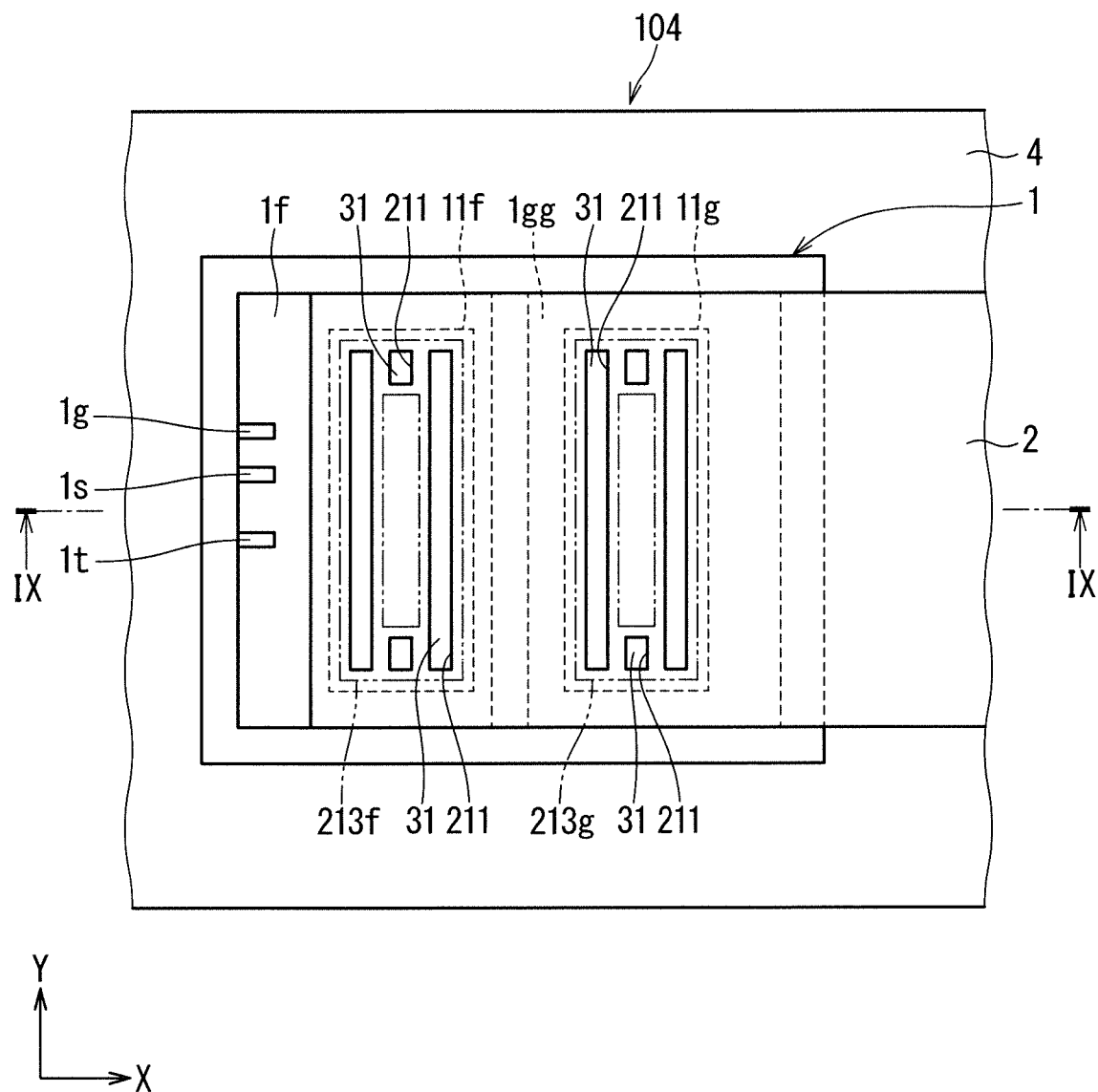

SEMICONDUCTOR DEVICE INCLUDING A SEMICONDUCTOR ELEMENT AND A LEAD FRAME WITH A PLURALITY OF HOLES

TECHNICAL FIELD

The present invention relates to a semiconductor device.

BACKGROUND ART

A semiconductor device having a bonded portion at which an electrode and a lead frame of a semiconductor element are connected by soldering without a bonding wire is well known.

PRIOR ART DOCUMENTS

Patent Documents

[Patent Document 1] Japanese Patent Application Laid-Open No. 2011-204886
[Patent Document 2] Japanese Patent Application Laid-Open No. 2012-69640

SUMMARY

Problem to be Solved by the Invention

In a semiconductor device, thermal stress occurs due to a thermal cycle caused by heat generation of a semiconductor element and a difference in linear expansion coefficient between different kinds of members constituting the semiconductor device. The thermal stress is remarkable at the end portion of the above bonded portion. At the end portion of the bonded portion, cracks are likely to occur due to the concentration of stress. Thermal stress is one of the causes of damage to the semiconductor element, and causes variations in the lives of semiconductor devices.

Patent Document 1 and Patent Document 2 have proposed a technique of opening a hole in a lead frame and filling the inside of the opening with solder or an adhesive.

Patent Document 1 exemplifies a configuration in which the holes are simply aligned in a row in the lead frame. With such a configuration, in a case where crack generation occurs at the end portion of the bonded portion, a crack apart from the holes is less suppressed from growing.

Patent Document 2 exemplifies a case where the holes provided in the lead frame are also located in the position of the end portion of the bonded portion. In this case, solder is thickly formed at a position where a hole is provided at the end portion of the bonded portion. When crack generation occurs at the end portion of the bonded portion, the crack is likely to grow toward the element at a position where the solder is thick.

An object of the present invention is to ensure a uniform life for the semiconductor devices.

Means to Solve the Problem

The semiconductor device (101 to 111) according to the present invention includes a semiconductor element (1) including an electrode (11, 11f, 11g, 11h, 11i), material of which is first metal, a lead frame (2) through which a plurality of holes (210) extend with an outer contour of the electrode being avoided in a first portion, and including the first portion (21), material of which is second metal, a bonding layer (5) interposed between the first portion and the electrode, and solder (31) being inside the plurality of holes and adjoining the bonding layer, the solder being thicker than the bonding layer. The plurality of holes include a plurality of first holes (211) extending through the first portion in a thickness direction of the first portion. The bonding layer includes a first bonding layer (51) located on the electrode side and being an alloy of the first metal and tin, and a second bonding layer (52) located on the first portion side and being an alloy of the second metal and tin. The plurality of first holes are located in an annular region (213, 213f, 213g, 213h, 213i) inside the outer contour of the electrode.

Effects of the Invention

Even if a crack occurs outside the annular region where the holes are located, the crack is less likely to grow further inward than the annular region.

A uniform life for semiconductor devices is ensured.

The explicit purpose, feature, phase, and advantage of the present invention will be described in detail hereunder with attached drawings.

BRIEF DESCRIPTION OF DRAWINGS

FIG. 8 A plan view illustrating a configuration of a semiconductor device according to Embodiment 4 of the invention.

DESCRIPTION OF EMBODIMENTS

Figure 1:
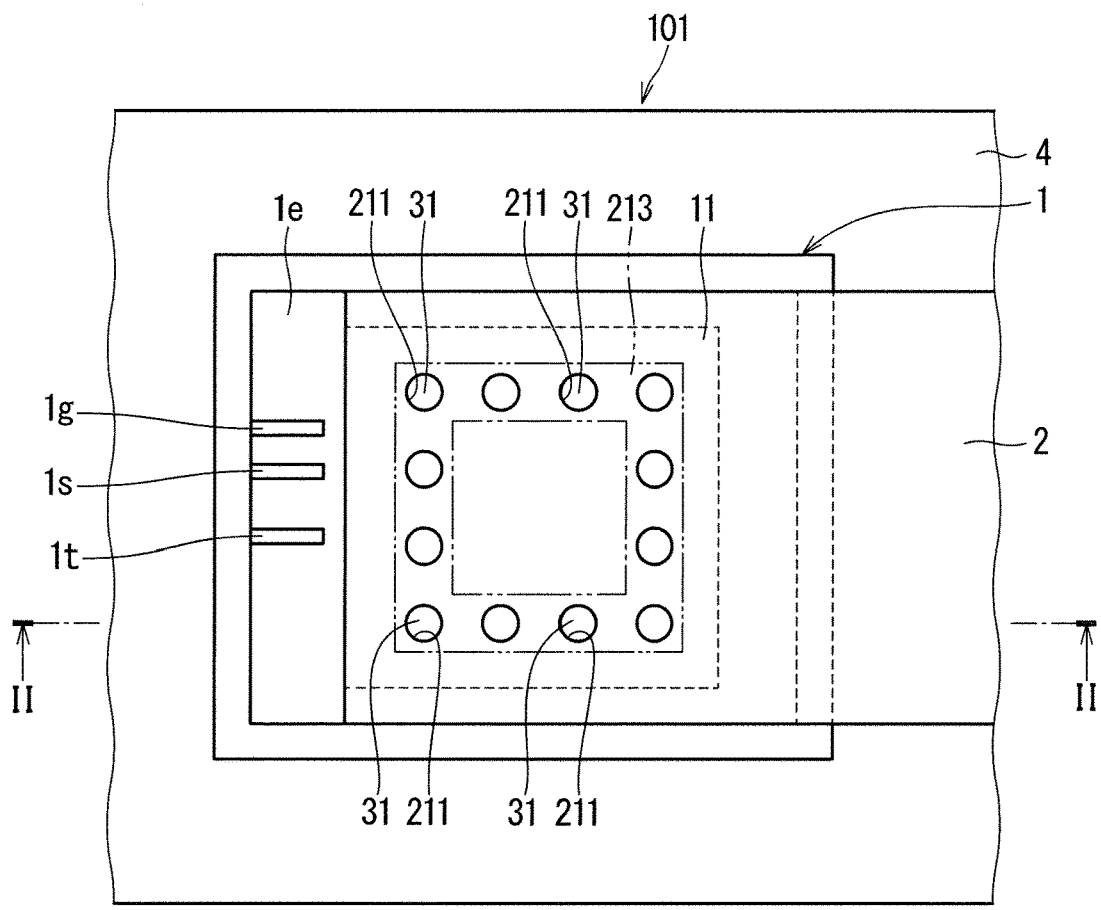
FIG. 1 A plan view illustrating a configuration of a semiconductor device according to Embodiment 1 of the invention.

In Embodiments described below, components having common names and reference numerals have the same or similar configuration or the same or similar function in any Embodiments unless otherwise specified.

Embodiment 1

Figure 2:
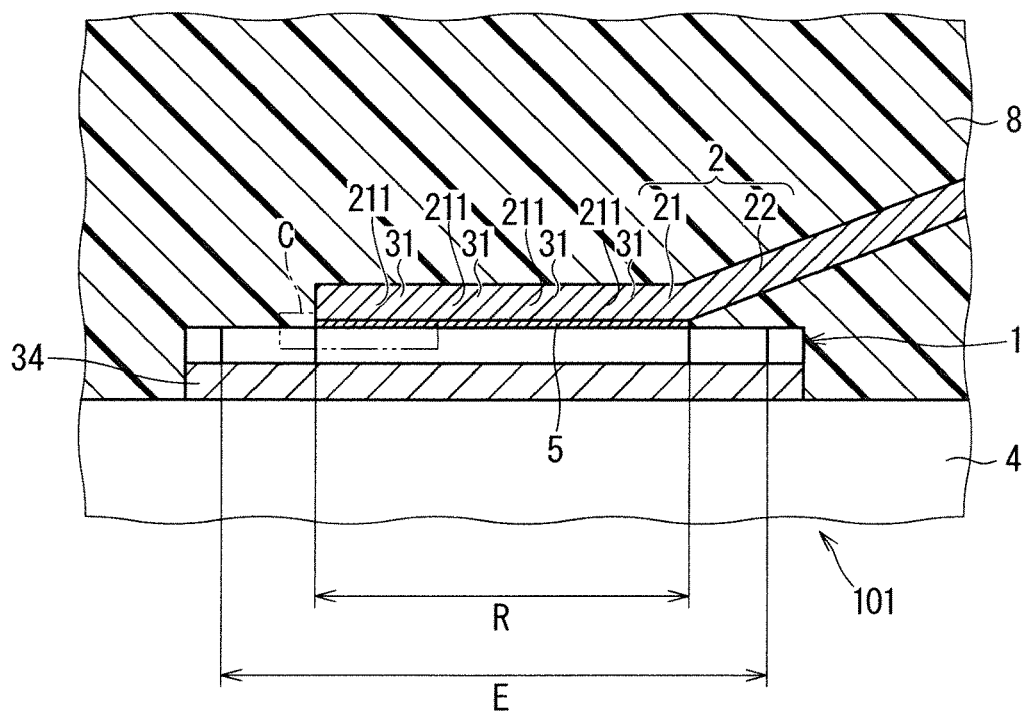
FIG. 2 A cross-sectional view illustrating the configuration of the semiconductor device according to Embodiment 1 of the invention.

FIG. 1 is a plan view illustrating a configuration of a semiconductor device 101 according to Embodiment 1 of the invention. FIG. 2 is a cross-sectional view illustrating the configuration of the semiconductor device 101, and illustrates a cross section at position II-II in FIG. 1.

The semiconductor device 101 includes a semiconductor element 1, a lead frame 2, a bonding layer 5, solder 31, and front metal 11. FIG. 2 illustrates a state in which the semiconductor device 101 further includes a sealing resin 8, and the sealing resin 8 is omitted in FIG. 1 in order to avoid complexity of illustration.

The semiconductor element 1 is, for example, a transistor having an emitter electrode 1e, a gate electrode 1g, and signal electrodes 1s and 1t. The front metal 11 is an electrode and is an object to which the lead frame 2 is connected. More specifically, the front metal 11 is a part of the emitter electrode 1e.

Each of the material of the front metal 11 and the material of the lead frame 2 is metal. First metal that is the material of the front metal 11 and second metal that is the material of the lead frame 2 may either be identical to or different from each other. The front metal 11 is subjected to surface treatment for the purpose of realizing solder bonding with the lead frame 2, and for example, for the purpose of enhancing solder wettability and is exposed to the outside of the semiconductor element 1. The bonding layer 5 is interposed between a first portion 21 and the front metal 11. The bonding layer 5 will be described later in detail.

The emitter electrode 1e and the front metal 11 are omitted in FIG. 2 in order to avoid complexity of illustration. However, in FIG. 2, the positions where the emitter electrode 1e and the front metal 11 are in a cross-sectional view are indicated as regions E and R, respectively.

The semiconductor device 101 may include a heat spreader 4 that radiates heat of the semiconductor element 1. In FIG. 2, a solder layer 34 that bonds the heat spreader 4 and the semiconductor element 1 is illustrated. In FIG. 1, the solder layer 34 is omitted in order to avoid complexity of illustration.

The lead frame 2 has the first portion 21 connected to the front metal 11 and a second portion 22 connected to the first portion 21 and is apart from the semiconductor element 1 farther than the first portion 21.

In the lead frame 2, a plurality of first holes 211 extends through the first portion 21 in the thickness direction of the first portion 21. The first holes 211 can be treated as a plurality of holes 210 described later in combination with second holes 212 described in Embodiment 2 or by the first holes 211 themselves alone.

Figure 3:
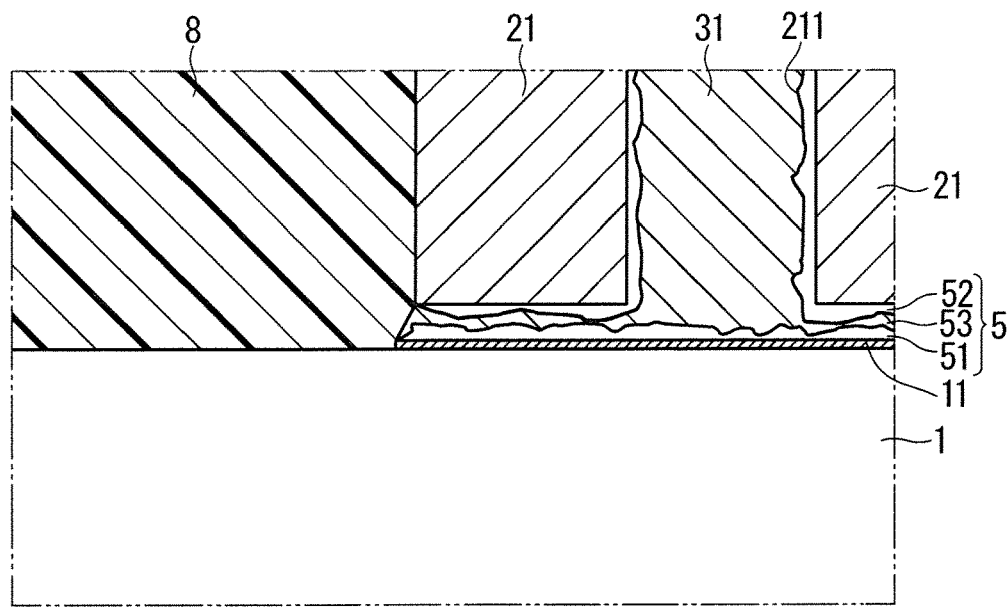
FIG. 3 A cross-sectional view illustrating a part of FIG. 2 in an enlarged manner.

FIG. 3 is a cross-sectional view illustrating a part of FIG. 2, specifically, an enlarged range C. The cross section of the front metal 11 is also illustrated in FIG. 3. The solder 31 is inside the first hole 211 and is thicker than the bonding layer 5. For example, the thickness of the bonding layer 5 is 30 to 100 μm, and the thickness of the solder 31 is about 10 times the thickness of the bonding layer 5. The solder 31 adjoins the bonding layer 5.

The bonding layer 5 has a first layer 51 and a second layer 52. Here, the case is illustrated where the bonding layer 5 further has a solder layer 53 interposed between the first layer 51 and the second layer 52. The solder layer 53 is connected to the solder 31.

The first layer 51 is an alloy of the first metal, which is the material of the front metal 11, and tin, and is located on the front metal 11 side. The second layer 52 is an alloy of the second metal, which is the material of the first portion 21, and tin, and is located on the first portion 21 side. The second layer 52 may be interposed between the inner surface of the first hole 211 and the solder 31. The first layer 51, the second layer 52, and the solder layer 53 are obtained by soldering the first portion 21 and the front metal 11.

The alloys of the first layer 51 and the second layer 52 are metal compounds, and the bonding layer 5 has lower mechanical strength than that of the solder 31. A crack caused by thermal stress is likely to occur in the bonding layer 5. Therefore, a crack is suppressed from growing toward the first hole 211 where the solder 31 exists. A crack is also suppressed from growing toward the semiconductor element 1.

Deformations caused by thermal stress tend to concentrate on the outer contour of the front metal 11, and the first holes 211 extend through the first portion 21 with the outer contour of the front metal 11 being avoided. More specifically, the first holes 211 extend through the first portion 21 in an annular region 213 inside the outer contour of the front metal 11.

In particular, in a case where the front metal 11 is rectangular, deformations in the respective directions of the pair of adjoining sides are tend to be concentrated in the portions at which the pair of sides adjoin each other, and degrees of deformation in the portions are large. For example, the first holes 211 extend through the first portion 21 inside the four corners of the front metal 11.

In FIG. 1, the case where the region 213 has a shape sandwiched by two rectangles (hereinafter, tentatively referred to as "rectangular ring shape") inside the four corners of the front metal 11 is illustrated. Then, the case where the first holes 211 are located at least at positions near the four corners of the front metal 11 in the region 213 is illustrated.

For example, the first hole 211 has a circular shape with a diameter of 0.3 to 2.0 mm in plan view, and four to twelve circles are arranged in one front metal 11. When the diameter of the first holes 211 is small, a state of intervals of the first holes 211 being narrow is advantageous from the viewpoint of suppressing the growth of cracks.

Deformations caused by thermal stress tend to concentrate on the outer contour of the front metal 11, whilst crack generation is less likely to occur at the central part of the front metal 11. Therefore, through holes may not be provided in the first portion 21 inside the region 213, that is, on the side opposite to the outer contour of the front metal 11.

The first holes 211 are located in the region 213 with the outer contour of the front metal 11 being avoided. Therefore, the solder 31 does not exist outside the region 213, and the region 213 is surrounded by the bonding layer 5. In the outer contour of the front metal 11 where crack generation is likely to occur, crack generation occurs in the bonding layer 5.

In the semiconductor device 101, as compared with the case where the solder 31 exists on the outer contour of the front metal 11 (see, Patent Document 2, for example), a crack is less likely to grow toward the semiconductor element 1. Therefore, this improves the life of the semiconductor device 101. A uniform life for the semiconductor devices 101 is well ensured as compared with the case where the solder 31 exists or does not exist outside the front metal 11.

Even if crack generation occurs outside the region 213, the solder 31 in the first holes 211 suppresses the growth of a crack. The semiconductor device 101 is advantageous from the viewpoint of suppressing the growth of cracks from multiple directions, as compared with a configuration in which the solders 31 are aligned simply (see Patent Document 1, for example).

Reducing the thickness of the bonding layer 5 is advantageous from the viewpoint of radiating the heat generated by the semiconductor element 1 to the first portion 21. The thin bonding layer 5 can be obtained by pressing the first portion 21 against the solder material with the solder material being placed on the front metal 11 when the bonding layer 5 and the solder 31 are formed, for example. The deformation of the first portion 21 before being pressed against the solder material is mitigated after being pressed against the solder material in the first portion 21. This is advantageous from the viewpoint of reducing the tolerance required for the dimensions of the lead frame 2.

When the first portion 21 is pressed against the solder material, the melted solder material is more readily introduced into the first holes 211 rather than it heads toward the periphery between the front metal 11 and the first portion 21. The presence of the first holes 211 is advantageous from the viewpoint of suppressing the solder material from protruding from between the front metal 11 and the first portion 21 to the periphery thereof. The solder material introduced into the first holes 211 becomes part or all of the solder 31.

In the semiconductor device 101, the through holes are not opened in the first portion 21 in the portion farther than the region 213 from the end portion of the front metal 11 (the inner peripheral side of the region 213). This is advantageous from the viewpoint of radiating heat from the semiconductor element 1 with the lead frame 2, considering that the temperature of the semiconductor element 1 typically tends to be high in the center thereof.

Embodiment 2

Figure 4:
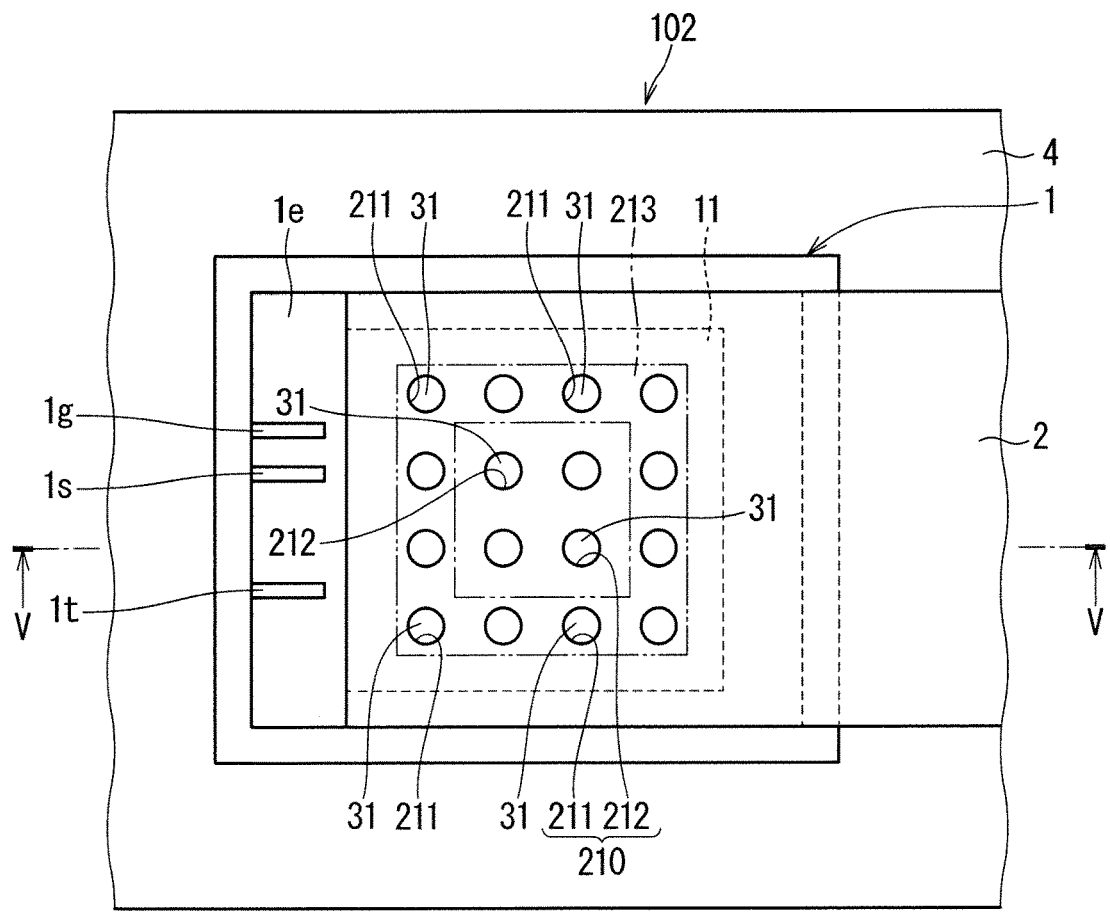
FIG. 4 A plan view illustrating a configuration of a semiconductor device according to Embodiment 2 of the invention.
Figure 5:
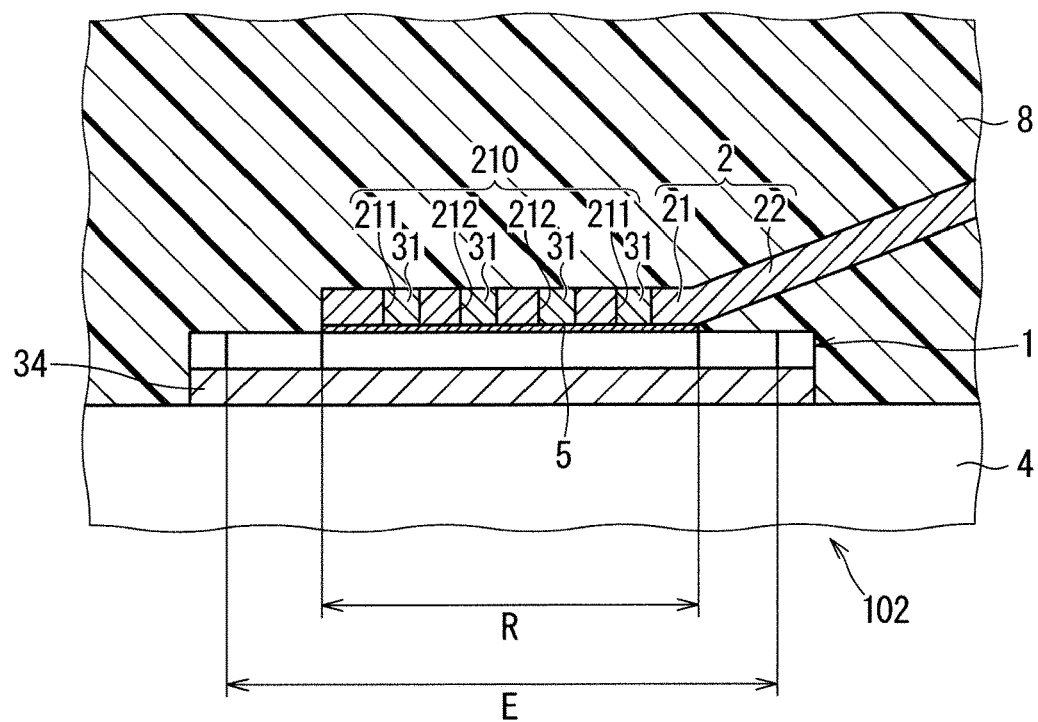
FIG. 5 A cross-sectional view illustrating the configuration of the semiconductor device according to Embodiment 2 of the invention.

FIG. 4 is a plan view illustrating a configuration of a semiconductor device 102 according to Embodiment 2 of the invention. FIG. 5 is a cross-sectional view illustrating the configuration of the semiconductor device 102, and illustrates a cross section at position V-V in FIG. 4.

As is the same with the semiconductor device 101, the semiconductor device 102 includes a semiconductor element 1, a lead frame 2, a bonding layer 5, solder 31, and front metal 11. FIG. 5 illustrates a state in which the semiconductor device 102 further includes a sealing resin 8, and the sealing resin 8 is omitted in FIG. 4 in order to avoid complexity of illustration.

The emitter electrode 1e and the front metal 11 are omitted in FIG. 5 in order to avoid complexity of illustration. However, in FIG. 5, the positions where the emitter electrode 1e and the front metal 11 are in a cross-sectional view are indicated as regions E and R, respectively.

The semiconductor device 102 may include a heat spreader 4. A solder layer 34 is illustrated in FIG. 5 while it is omitted in FIG. 4.

As is the same with the semiconductor device 101, in the semiconductor device 102, a plurality of first holes 211 extend through in the thickness direction of the first portion 21 in the region 213. Unlike the semiconductor device 101, in the semiconductor device 102, a plurality of second holes 212 extend through in the thickness direction of the first portion 21 on the inner peripheral side of the region 213. The first holes 211 are treated as a plurality of holes 210 together with the second holes 212. The solder 31 is also inside the second holes 212 and adjoins the bonding layer 5, and is thicker than the bonding layer 5.

The semiconductor device 102 has the same or similar configuration as the semiconductor device 101 except for the second holes 212, and therefore, the same effect as the semiconductor device 101 is exhibited. However, the semiconductor device 101 is more advantageous than the semiconductor device 102 in terms of radiating the heat from the semiconductor element 1 with the lead frame 2. This is because the first portion 21 does not open on the inner peripheral side of the region 213 in the semiconductor device 101.

However, in comparison with a configuration in which the center of the semiconductor element 1 is widely covered with a solder material (for example, it is understood that a solder material is injected into the through-hole 505 having a rectangular plane shape illustrated in FIG. 5 of Patent Document 1), even the semiconductor device 102, it is advantageous from the viewpoint of heat radiation with the first portion 21.

Embodiment 3

Figure 6:
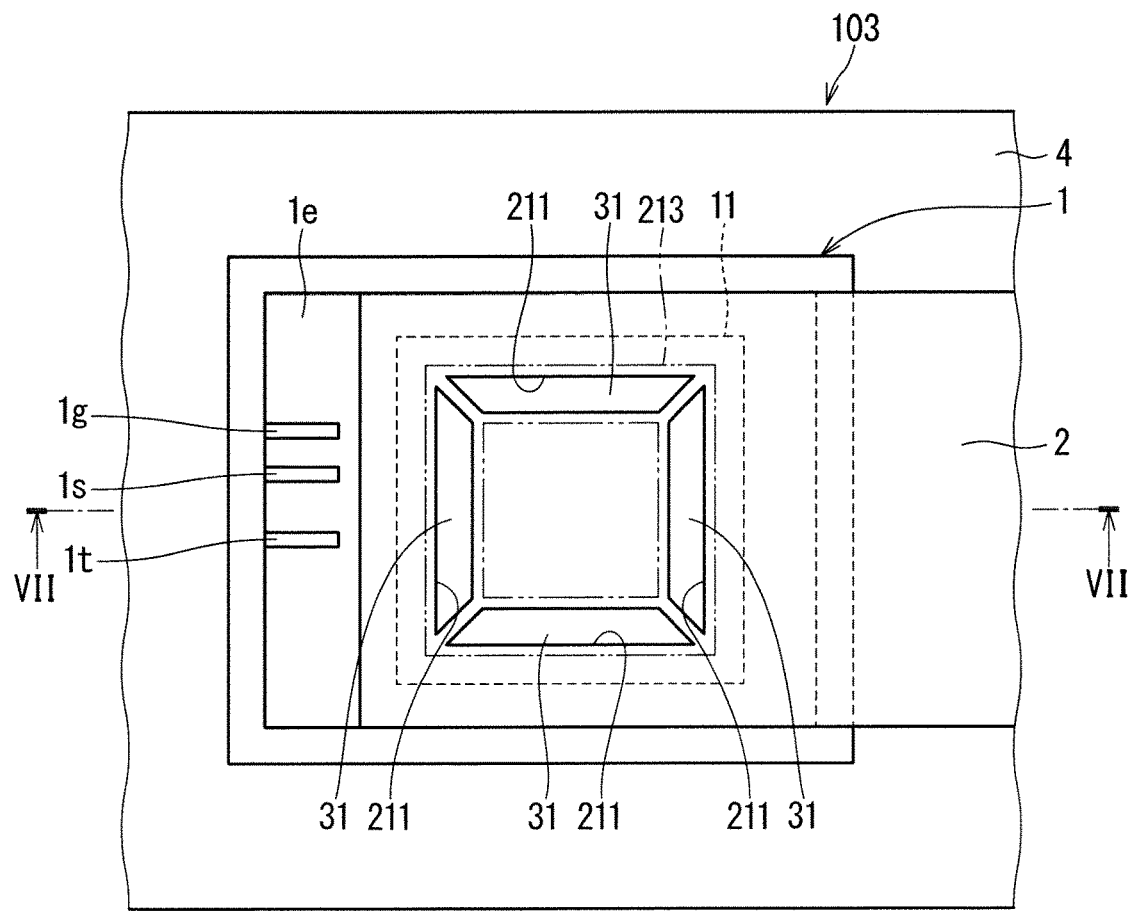
FIG. 6 A plan view illustrating a configuration of a semiconductor device according to Embodiment 3 of the invention.
Figure 7:
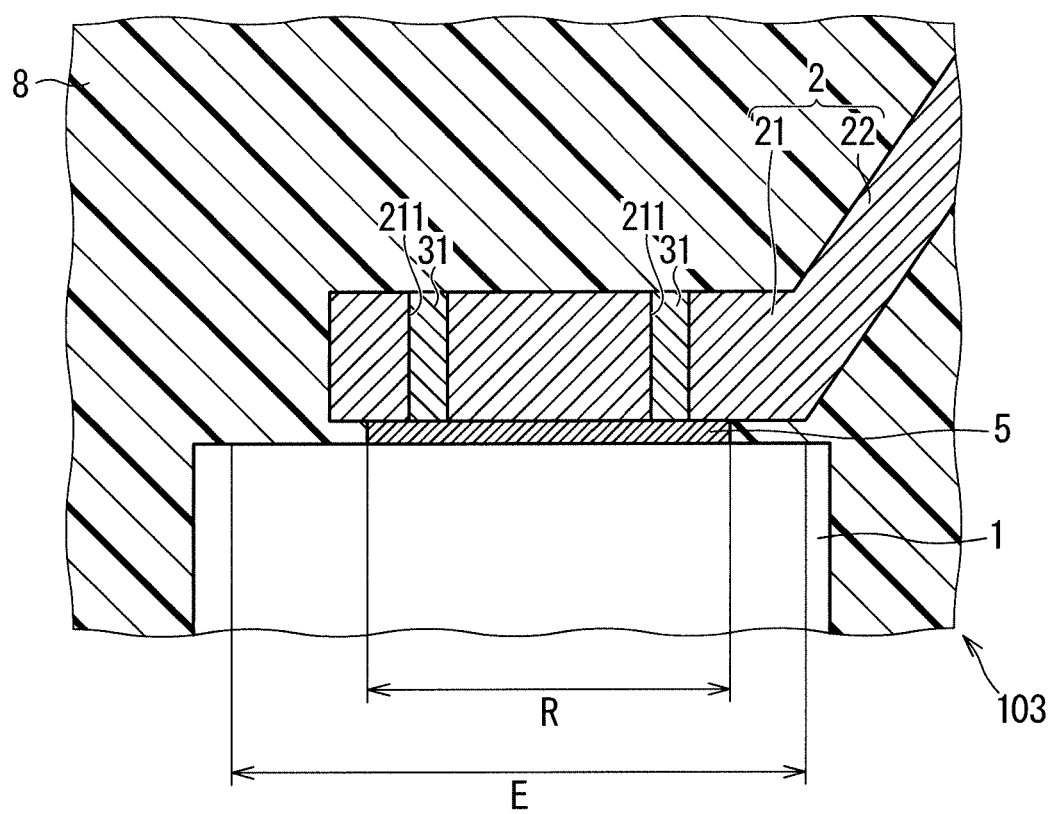
FIG. 7 A cross-sectional view illustrating the configuration of the semiconductor device according to Embodiment 3 of the invention.

FIG. 6 is a plan view illustrating a configuration of a semiconductor device 103 according to Embodiment 3 of the invention. FIG. 7 is a cross-sectional view illustrating the configuration of the semiconductor device 103, and illustrates a cross section at position VII-VII in FIG. 6.

As is the same with the semiconductor device 101, the semiconductor device 103 includes a semiconductor element 1, a lead frame 2, a bonding layer 5, solder 31, and front metal 11. FIG. 7 illustrates a state in which the semiconductor device 103 further includes a sealing resin 8, and the sealing resin 8 is omitted in FIG. 6 in order to avoid complexity of illustration.

The emitter electrode 1e and the front metal 11 are omitted in FIG. 7 in order to avoid complexity of illustration. However, in FIG. 7, the positions where the emitter electrode 1e and the front metal 11 are in a cross-sectional view are indicated as regions E and R, respectively.

The semiconductor device 103 may include a heat spreader 4. FIG. 7 illustrates a cross section of the semiconductor element 1 and the lead frame 2 side further to the semiconductor element 1. The heat spreader 4 is omitted in FIG. 7 together with the solder layer 34 described in Embodiments 1 and 2.

As is the same with the semiconductor device 101, in the semiconductor device 103, a plurality of first holes 211 extend through in the thickness direction of the first portion 21 in the region 213. In the semiconductor device 103, the shape of the first holes 211 is different from that of the semiconductor device 101.

Specifically, the first holes 211 have slit shapes elongated along the region 213. In the example of FIG. 6, the region 213 takes a rectangular ring shape, and a first hole 211 appears in a substantially rectangular shape in plan view, for example, a trapezoidal shape. It is advantageous that the first holes 211 have a slit shape from the viewpoint of enhancing the effect of suppressing the crack generated in the outer contour of the front metal 11 from growing toward the inner peripheral side of the region 213.

The dimensions of the first hole 211 are, for example, 3 to 6 mm in length in the longitudinal direction and 1 to 3 mm in length in the lateral direction.

The semiconductor device 103 is also advantageous from the viewpoint of radiating heat from the semiconductor element 1 with the lead frame 2 in a similar manner to the semiconductor device 101.

Embodiment 4

Figure 9:
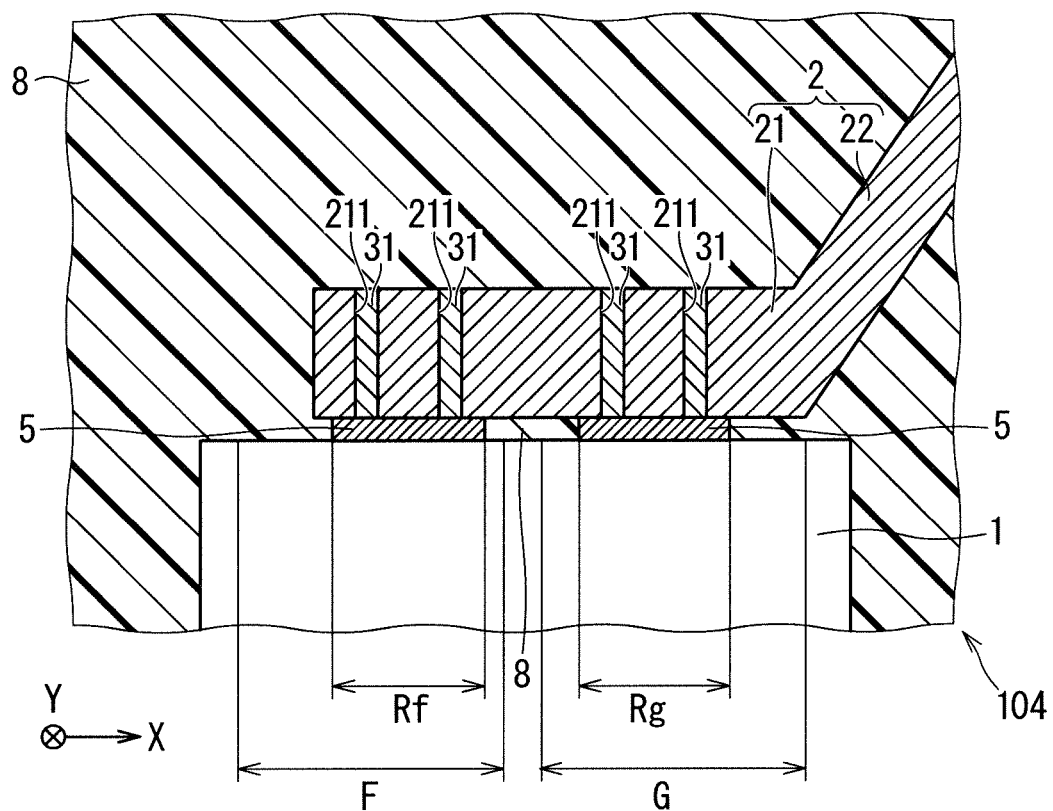
FIG. 9 A cross-sectional view illustrating the configuration of the semiconductor device according to Embodiment 4 of the invention.

FIG. 8 is a plan view illustrating a configuration of a semiconductor device 104 according to Embodiment 4 of the invention. FIG. 9 is a cross-sectional view illustrating the configuration of the semiconductor device 104, and illustrates a cross section at position IX-IX in FIG. 8.

As is the same with the semiconductor device 101, the semiconductor device 104 includes a semiconductor element 1, a lead frame 2, a bonding layer 5, and solder 31. The semiconductor device 104 includes emitter electrodes 1f and 1gg instead of the emitter electrode 1e in the semiconductor device 101. The semiconductor device 104 includes front metal 11f and front metal 11g instead of the front metal 11 in the semiconductor device 101.

The emitter electrodes 1f and 1gg are isolated from each other in parallel with the first portion 21. The emitter electrodes 1f and 1gg are aligned along the direction X in which the lead frame 2 extends. The front metal 11f and the front metal 11g are isolated from each other in parallel with the first portion 21. The front metal 11f and the front metal 11g are aligned along the direction X. Note that, as the direction Y different from the direction X, a direction perpendicular to the direction X and parallel to the first portion 21 is illustrated in FIGS. 8 and 9. FIG. 9 illustrates a cross section parallel to the direction X.

The front metal 11f and the front metal 11g are both electrodes and are parts of the emitter electrodes 1f and 1gg, respectively, to which the lead frame 2 is connected. Each of the material of the front metal 11f and the front metal 11g is metal as is the same with the front metal 11 and is subjected to surface treatment for the purpose of realizing solder bonding with the lead frame 2, and for example, for the purpose of enhancing solder wettability and is exposed to the outside of the semiconductor element 1.

The emitter electrodes 1f and 1gg, the front metal 11f, and the front metal 11g are omitted in FIG. 9 in order to avoid complexity of illustration. However, in FIG. 9, the positions where the emitter electrodes 1f and 1gg, and the front metal 11f and the front metal 11g are in a cross-sectional view are indicated as regions F, G, Rf, and Rg, respectively.

The bonding layers 5 are interposed not only between the front metal 11f and the first portion 21 but between the front metal 11g and the first portion 21. However, no bonding layer 5 exists between the front metal 11f and the front metal 11g (between the regions Rf and Rg).

Similar to the configuration illustrated in FIG. 3, the bonding layer 5 has a first layer 51 and a second layer 52. The first layer 51 included in the bonding layer 5 between the front metal 11f and the first portion 21 is an alloy of the metal, which is the material of the front metal 11f and tin, and is provided on the front metal 11f side. The first layer 51 included in the bonding layer 5 between the front metal 11g and the first portion 21 is an alloy of the metal, which is the material of the front metal 11g and tin, and is located on the front metal 11g side.

FIG. 9 illustrates a state in which the semiconductor device 104 further includes a sealing resin 8, and the sealing resin 8 is omitted in FIG. 8 in order to avoid complexity of illustration. In the semiconductor device 104, no bonding layer 5 exists between the regions Rf and Rg, reflecting that the front metal 11f and the front metal 11g are isolated from one another. When the sealing resin 8 is provided, the flowing sealing resin 8 can pass between the regions Rf and Rg. Therefore, providing the front metal 11f and the front metal 11g in an isolated manner is advantageous from the viewpoint of enhancing the fluidity of the sealing resin 8.

The semiconductor device 104 may include a heat spreader 4. FIG. 9 illustrates a cross section of the semiconductor element 1 and the lead frame 2 side further to the semiconductor element 1. The heat spreader 4 is omitted in FIG. 9 together with the solder layer 34 described in Embodiments 1 and 2.

Deformations caused by thermal stress tend to concentrate on the outer contours of the front metal 11f and the front metal 11g, and the first holes 211 extend through the first portion 21 with the outer contours of the front metal 11f and the front metal 11g being avoided. More specifically, the first holes 211 extend through the first portion 21 in an annular region 213f inside the outer contour of the front metal 11f and an annular region 213g inside the outer contour of the front metal 11g.

In particular, in a case where the front metal 11f and the front metal 11g are rectangular, deformations in the respective directions of the pair of adjoining sides are tend to be concentrated in the portions at which the pair of sides adjoin each other, that is, the degrees of deformation in the portions are large. For example, the first holes 211 extend through the first portion 21 inside the four corners of the front metal 11f and the front metal 11g.

FIG. 8 illustrates a case where the region 213f takes a rectangular ring shape inside the four corners of the front metal 11f and the region 213g takes a rectangular ring shape inside the four corners of the front metal 11g. And also illustrated is the case where the first holes 211 are located at least near the four corners of the front metal 11f in the region 213$f$, and the first holes 211 are located at least near the four corners of the front metal 11$g$ in the region 213$g$.

The first holes 211 are located in the region 213$f$ and the region 213$g$ with the outer contours of the front metal 11$f$ and the front metal 11$g$ being avoided. Therefore, no solder 31 exists outside the regions 213$f$ and 213$g$. The regions 213$f$ and 213$g$ are surrounded by the bonding layers 5. In the outer contours of the front metal 11$f$ and the front metal 11$g$, crack generation is likely to occur in the bonding layer 5.

Even if crack generation occurs outside the regions 213$f$ and 213$g$, the solder 31 in the first holes 211 suppresses the growth of a crack in a similar manner to the semiconductor device 101. A crack is also suppressed from growing toward the semiconductor element 1. Therefore, this improves the life of the semiconductor device 104. A uniform life for the semiconductor devices 104 is ensured as compared with the case where the solder 31 exists or does not exist outside the front metal 11$f$ and the front metal 11$g$.

The first holes 211 arranged at the end portions of the regions 213$f$ and 213$g$ along the direction X are long along the direction Y. This is similar to the first holes 211 of the semiconductor device 103 described in Embodiment 3, and it is advantageous from the viewpoint of enhancing the effect of suppressing the cracks generated in the outer contours of the front metal 11$f$ and the front metal 11$g$ from growing toward the inner peripheral sides of the regions 213$f$ and 213$g$, particularly in the direction X and the opposite direction thereof.

Embodiment 5

Figure 10:
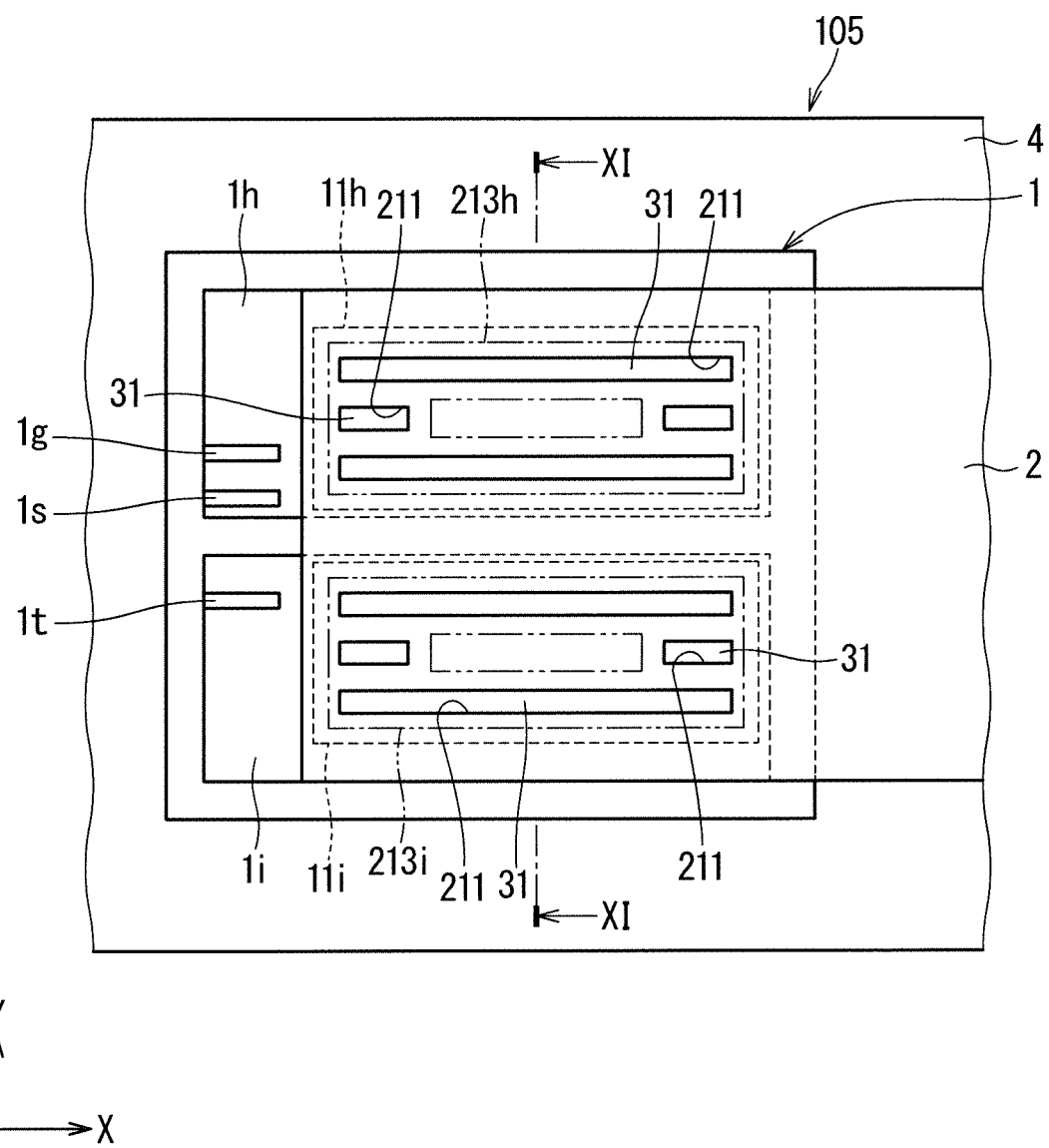
FIG. 10 A plan view illustrating a configuration of a semiconductor device according to Embodiment 5 of the invention.
Figure 11:
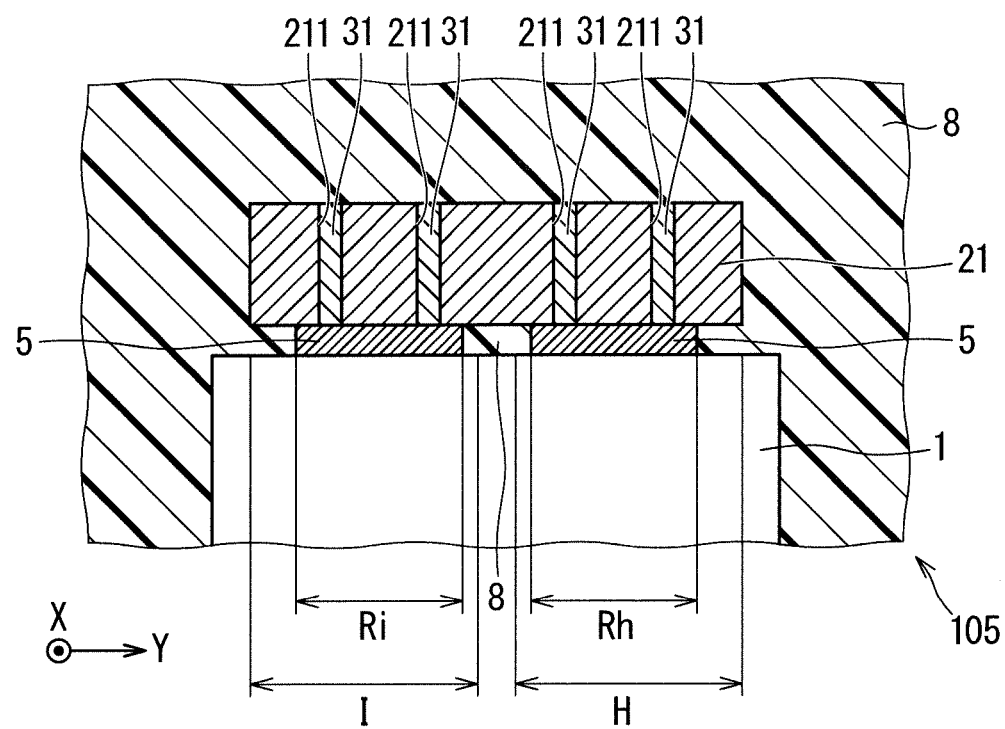
FIG. 11 A cross-sectional view illustrating the configuration of the semiconductor device according to Embodiment 5 of the invention.

FIG. 10 is a plan view illustrating a configuration of a semiconductor device 105 according to Embodiment 5 of the invention. FIG. 11 is a cross-sectional view illustrating the configuration of the semiconductor device 105, and illustrates a cross section at position XI-XI in FIG. 10.

As is the same with the semiconductor device 101, the semiconductor device 105 includes a semiconductor element 1, a lead frame 2, a bonding layer 5, and solder 31. The semiconductor device 105 includes emitter electrodes 1$h$ and 1$i$ instead of the emitter electrode 1$e$ in the semiconductor device 101. The semiconductor device 105 includes front metal 11$h$ and front metal 11$i$ instead of the front metal 11 in the semiconductor device 101.

The emitter electrodes 1$h$ and 1$i$ are isolated from each other in parallel with the first portion 21. The emitter electrodes 1$h$ and 1$i$ are aligned along the direction Y different from the direction X in which the lead frame 2 extends. The front metal 11$h$ and the front metal 11$i$ are isolated from each other in parallel with the first portion 21. The front metal 11$h$ and the front metal 11$i$ are aligned along the direction Y. Note that, as the direction Y, a direction perpendicular to the direction X and parallel to the first portion 21 is illustrated in FIGS. 10 and 11. FIG. 11 illustrates a cross section parallel to the direction Y.

The front metal 11$h$ and the front metal 11$i$ are both electrodes and are a part of the emitter electrodes 1$h$ and 1$i$, respectively, to which the lead frame 2 is connected. Each of the material of front metal 11$h$ and the front metal 11$i$ is metal as is the same with the front metal 11 and is subjected to surface treatment for the purpose of realizing solder bonding with the lead frame 2, and for example, for the purpose of enhancing solder wettability and is exposed to the outside of the semiconductor element 1.

The emitter electrodes 1$h$ and 1$i$, the front metal 11$h$, and the front metal 11$i$ are omitted in FIG. 11 in order to avoid complexity of illustration. However, in FIG. 11, the positions where the emitter electrodes 1$h$ and 1$i$, and the front metal 11$h$ and the front metal 11$i$ are in a cross-sectional view are indicated as regions I, H, Rh, and Ri, respectively.

The bonding layers 5 are interposed not only between the front metal 11$h$ and the first portion 21 but between the front metal 11$i$ and the first portion 21. However, no bonding layer 5 exists between the front metal 11$h$ and the front metal 11$i$ (between the regions Rh and Ri).

Similar to the configuration illustrated in FIG. 3, the bonding layer 5 has a first layer 51 and a second layer 52. The first layer 51 included in the bonding layer 5 between the front metal 11$h$ and the first portion 21 is an alloy of the metal, which is the material of the front metal 11$h$ and tin, and is located on the front metal 11$h$ side. The first layer 51 included in the bonding layer 5 between the front metal 11$i$ and the first portion 21 is an alloy of the metal, which is the material of the front metal 11$i$ and tin, and is located on the front metal 11$i$ side.

FIG. 11 illustrates a state in which the semiconductor device 105 further includes a sealing resin 8, and the sealing resin 8 is omitted in FIG. 10 in order to avoid complexity of illustration. In the semiconductor device 105, no bonding layer 5 exists between the regions Rh and Ri, reflecting that the front metal 11$h$ and the front metal 11$i$ are isolated from one another. When the sealing resin 8 is provided, the flowing sealing resin 8 can pass between the regions Rh and Ri. Therefore, providing the front metal 11$h$ and the front metal 11$i$ in an isolated manner is advantageous from the viewpoint of enhancing the fluidity of the sealing resin 8.

The semiconductor device 105 may include a heat spreader 4. FIG. 11 illustrates a cross section of the semiconductor element 1 and the lead frame 2 side further to the semiconductor element 1. The heat spreader 4 is omitted in FIG. 11 together with the solder layer 34 described in Embodiments 1 and 2.

Deformations caused by thermal stress tend to concentrate on the outer contours of the front metal 11$h$ and the front metal 11$i$, and the first holes 211 extend through the first portion 21 with the outer contours of the front metal 11$h$ and the front metal 11$i$ being avoided. More specifically, the first holes 211 extend through the first portion 21 in an annular region 213$h$ inside the outer contour of the front metal 11$h$ and an annular region 213$i$ inside the outer contour of the front metal 11$i$.

In particular, in a case where the front metal 11$h$ and the front metal 11$i$ are rectangular, deformations in the respective directions of the pair of adjoining sides are tend to be concentrated in the portions at which the pair of sides adjoin each other, that is, the degrees of deformation in the portions are large. For example, the first holes 211 extend through the first portion 21 inside the four corners of the front metal 11$h$ and the front metal 11$i$.

FIG. 10 illustrates a case where the region 213$h$ takes a rectangular ring shape inside the four corners of the front metal 11$h$ and the region 213$i$ takes a rectangular ring shape inside the four corners of the front metal 11$i$. And also illustrated is the case where the first holes 211 are located at least near the four corners of the front metal 11$h$ in the region 213$h$, and the first holes 211 are located at least near the four corners of the front metal 11$i$ in the region 213$i$.

The first holes 211 are located in the region 213$h$ and the region 213$i$ with the outer contours of the front metal 11$h$ and the front metal 11$i$ being avoided. Therefore, no solder 31 exists outside the regions 213$h$ and 213$i$. The regions 213$h$ and 213$i$ are surrounded by the bonding layers 5. In the outer contours of the front metal 11$h$ and the front metal 11$i$, crack generation is likely to occur in the bonding layer 5.

Even if crack generation occurs outside the regions 213*h* and 213*i*, the solder 31 in the first holes 211 suppresses the growth of a crack in a similar manner to the semiconductor device 101. A crack is also suppressed from growing toward the semiconductor element 1. Therefore, this improves the life of the semiconductor device 105. A uniform life for the semiconductor devices 105 is ensured as compared with the case where the solder 31 exists or does not exist outside the front metal 11*h* and the front metal 11*i*.

The first holes 211 arranged at the end portions of the regions 213*h* and 213*i* along the direction Y are long along the direction X. This is similar to the first holes 211 of the semiconductor device 103 described in Embodiment 3, and it is advantageous from the viewpoint of enhancing the effect of suppressing the cracks generated in the outer contours of the front metal 11*h* and the front metal 11*i* from growing toward the inner peripheral sides of the regions 213*h* and 213*i*, particularly in the direction Y and the opposite direction thereof.

Embodiment 6

Figure 12:
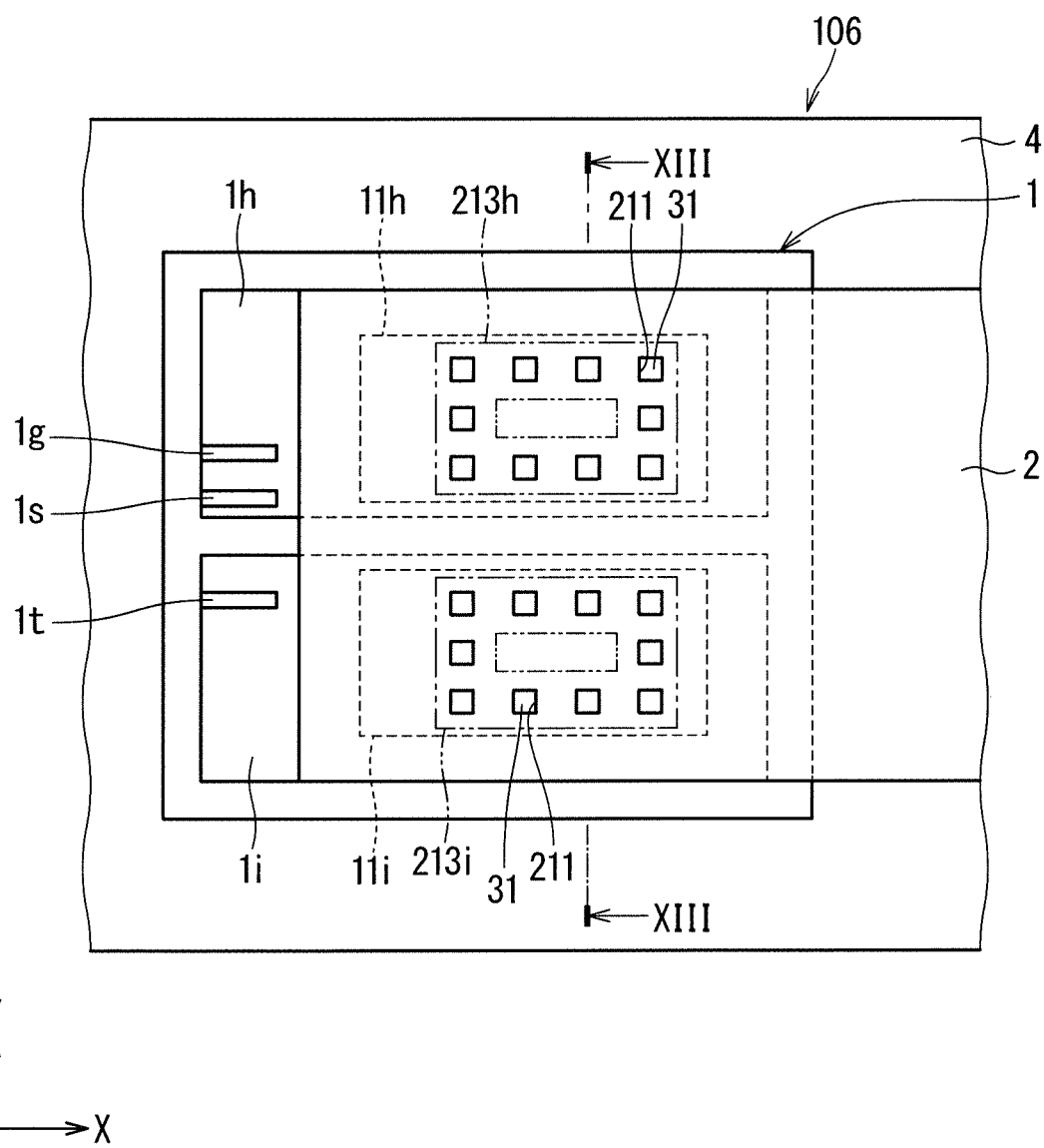
FIG. 12 A plan view illustrating a configuration of a semiconductor device according to Embodiment 6 of the invention.
Figure 13:
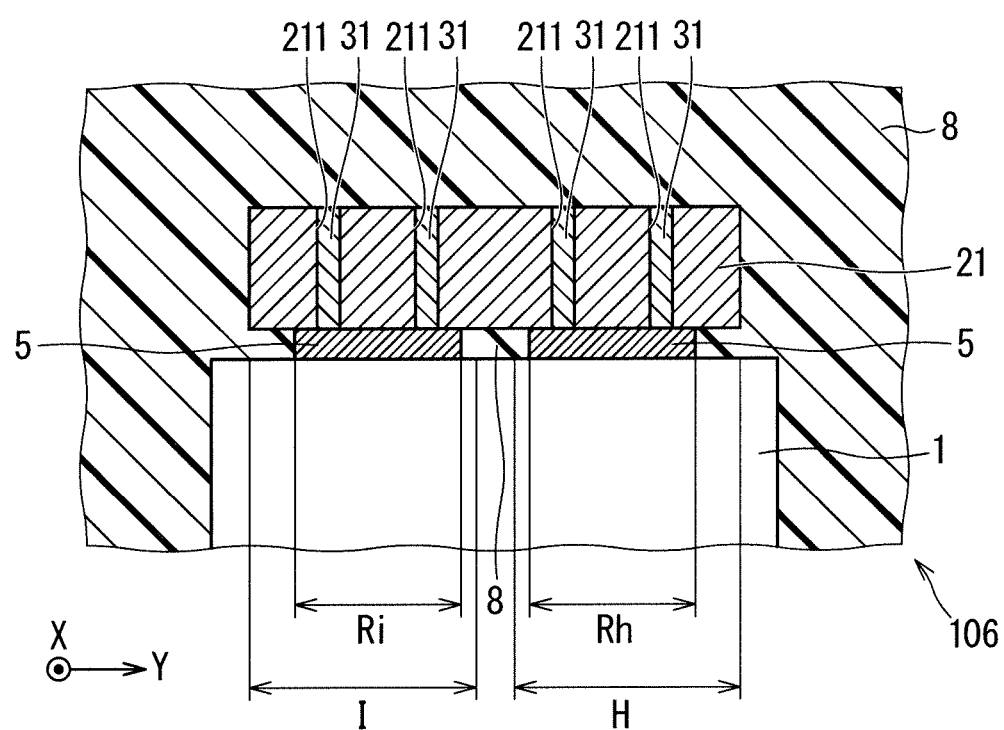
FIG. 13 A cross-sectional view illustrating the configuration of the semiconductor device according to Embodiment 6 of the invention.

FIG. 12 is a plan view illustrating a configuration of a semiconductor device 106 according to Embodiment 6 of the invention. FIG. 13 is a cross-sectional view illustrating the configuration of the semiconductor device 106, and illustrates a cross section at position XIII-XIII in FIG. 12.

The semiconductor device 106 adopts the same configuration as the semiconductor device 105, except that the shape of the first hole 211 is different. More specifically, in the semiconductor device 106, the first holes 211 existing at the end portions along the direction Y in the regions 213*h* and 213*i* (hereinafter tentatively referred to as "direction Y end portions") do not have the characteristic of being long along the direction X. The longitudinal direction of rectangular ring shapes taken by the regions 213*h* and 213*i* are along the direction X, and a plurality of first holes 211 are at the direction Y end portions.

As is the same with the semiconductor device 105, in the semiconductor device 106, improvement of the life, uniformity, and suppression of the growth of cracks are achievable. However, the semiconductor device 105 has a higher effect of suppressing cracks generated in the outer contours of the front metal 11*h* and the front metal 11*i* from growing toward the inner peripheral sides of the regions 213*h* and 213*i*, particularly in the direction Y and the opposite direction thereof.

The semiconductor device 106 includes the front metal 11*h* and the front metal 11*i* in an isolated manner; therefore, it is more advantageous from the viewpoint of enhancing the fluidity of the sealing resin 8 as compared with the semiconductor device 101 (see FIG. 1).

Embodiment 7

Figure 14:
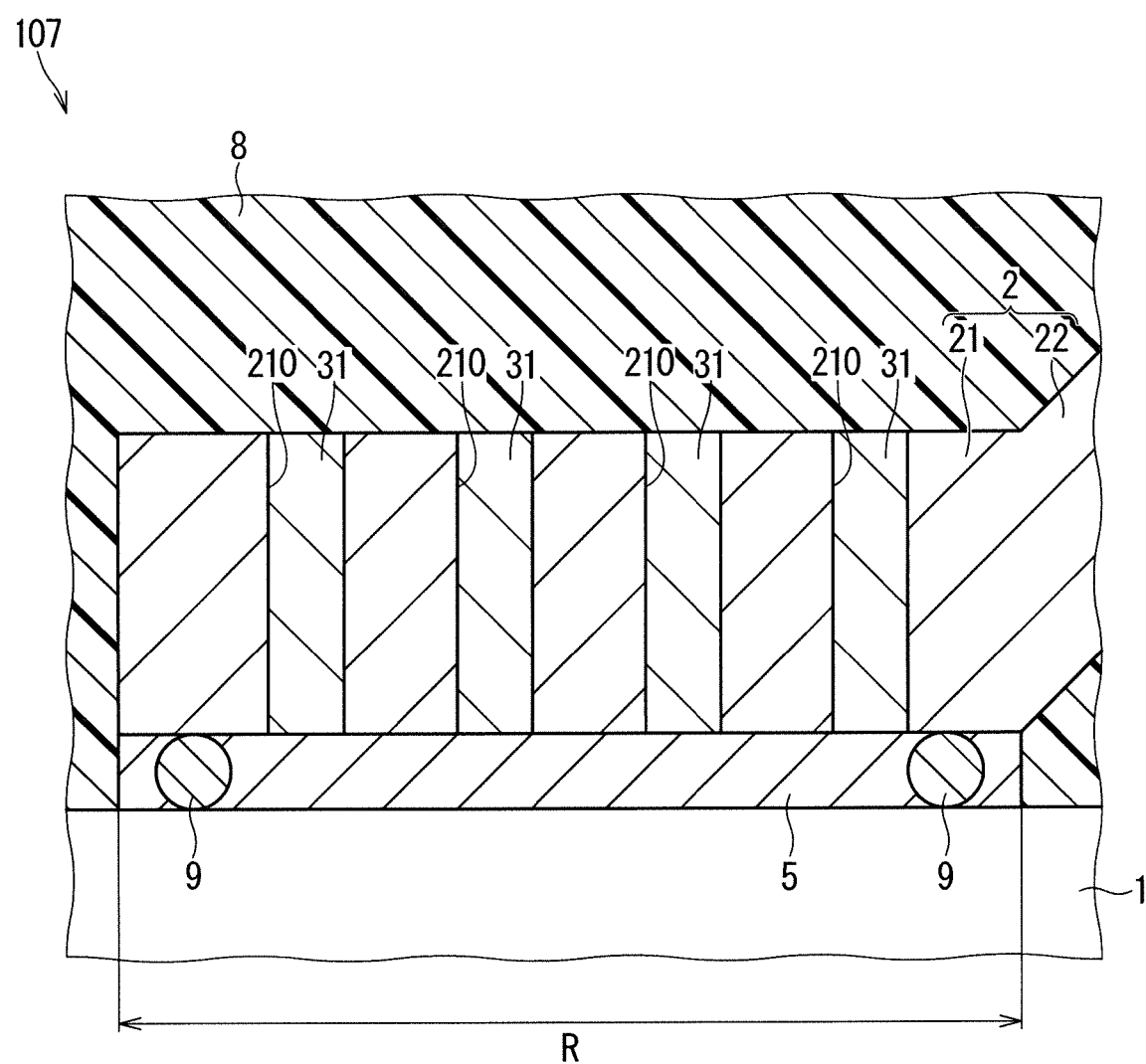
FIG. 14 A cross-sectional view illustrating a configuration of a semiconductor device according to Embodiment 7 of the invention.

FIG. 14 is a cross-sectional view illustrating a configuration of a semiconductor device 107 according to Embodiment 7 of the invention. The semiconductor device 107 has a configuration in which the semiconductor device 101 is further provided with a plurality of protrusions 9.

FIG. 14 illustrates a cross section at a position where a pair of protrusions 9 and a plurality of holes 210 (which may be the first holes 211 or the second holes 212) appear. In FIG. 14, the heat spreader 4 side (the side opposite to the lead frame 2) from the semiconductor element 1 is omitted.

The protrusions 9 are interposed between the first portions 21 and the semiconductor element 1. FIG. 14 illustrates a case where the protrusions 9 exist at the end portions of the region R where the front metal 11 exists.

The protrusion 9 has a height of, for example, 30 to 100 μm. The presence of the protrusions 9 is advantageous from the viewpoint of securing the minimum thickness of the bonding layer 5. The presence of the protrusions 9 is advantageous from the viewpoint of making the thickness of the bonding layer 5 uniform.

From the viewpoint of obtaining electrical conductivity between the lead frame 2 and the semiconductor element 1, more specifically, the front metal 11 (or the emitter electrode 1*e*), it is advantageous that the protrusion 9 is formed of metal, for example, copper or aluminum.

Embodiment 8

Figure 15:
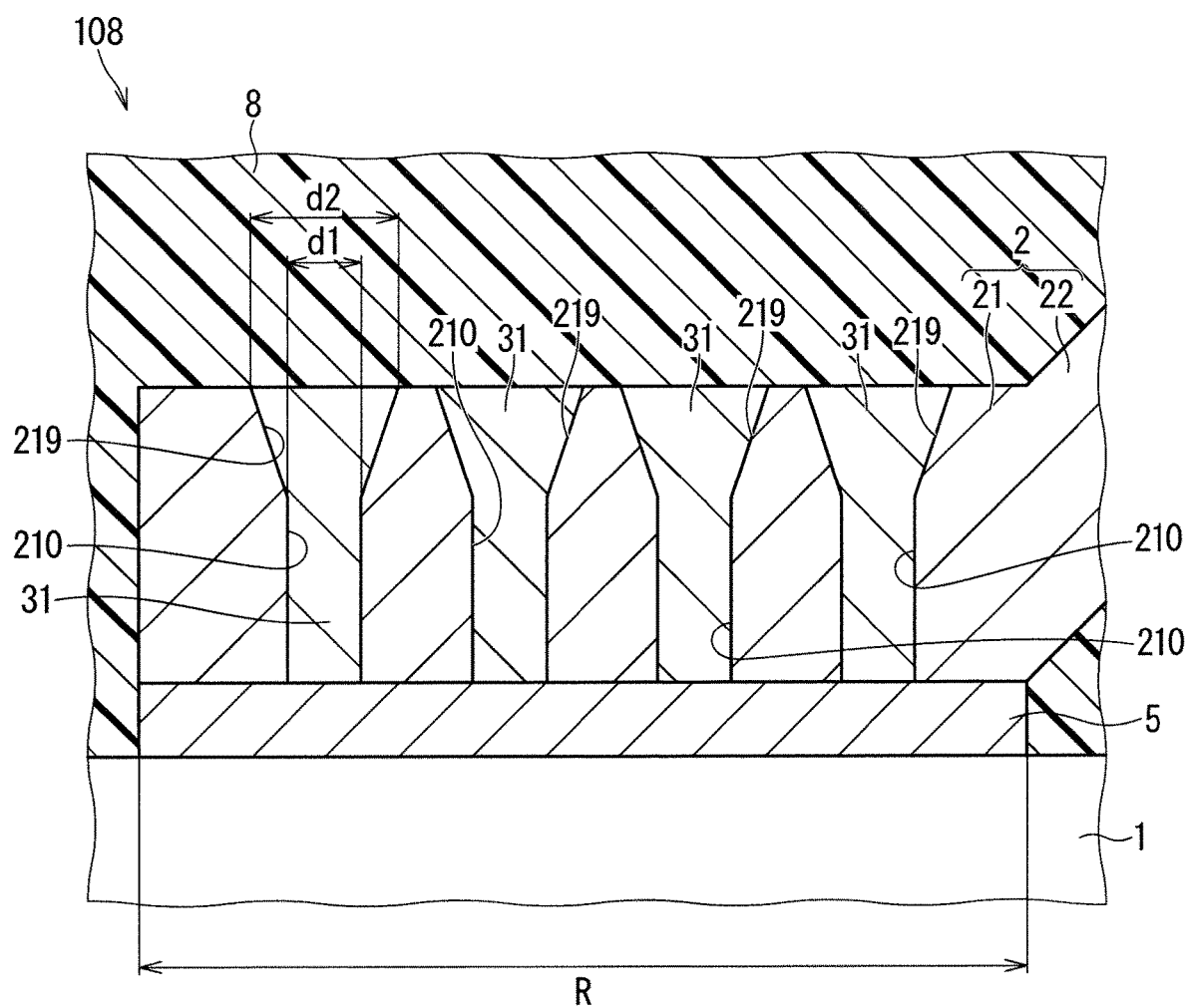
FIG. 15 A cross-sectional view illustrating a configuration of a semiconductor device according to Embodiment 8 of the invention.

FIG. 15 is a cross-sectional view illustrating a configuration of a semiconductor device 108 according to Embodiment 8 of the invention. The semiconductor device 108 has a configuration in which a first hole 211 has an opening 219 in the semiconductor device 101. Here, the first holes 211 are illustrated as the holes 210. That is, Embodiment 8 also illustrates the application to the case where the second holes 212 are provided.

FIG. 15 illustrates a cross section at a position where a plurality of holes 210 appear. In FIG. 15, the heat spreader 4 side (the side opposite to the lead frame 2) from the semiconductor element 1 is omitted.

An opening 219 exists on opposite side to the semiconductor element 1 in the hole 210, and the diameter thereof is wider as the distance from the semiconductor element 1 increases. More specifically, the diameter d2 of the hole 210 appearing on the surface of the first portion 21 on the side opposite to the semiconductor element 1 is larger than the diameter d1 of the hole 210 on the semiconductor element 1 side.

The presence of the openings 219 is advantageous from the viewpoint of forming the solder 31 by dropping molten solder from the side opposite to the semiconductor element 1 onto the surface of the lead frame 2. This is because inclination of the inner wall of the opening 219 with respect to the thickness direction of the first portion 21 induces the dropped molten solder to flow to the semiconductor element 1 (more specifically, to the region R where the front metal 11 exists).

The entire hole 210 may be the opening 219. That is, the diameter of the hole 210 in the first portion 21 may be wider as the distance from the semiconductor element 1 increases.

Embodiment 9

Figure 16:
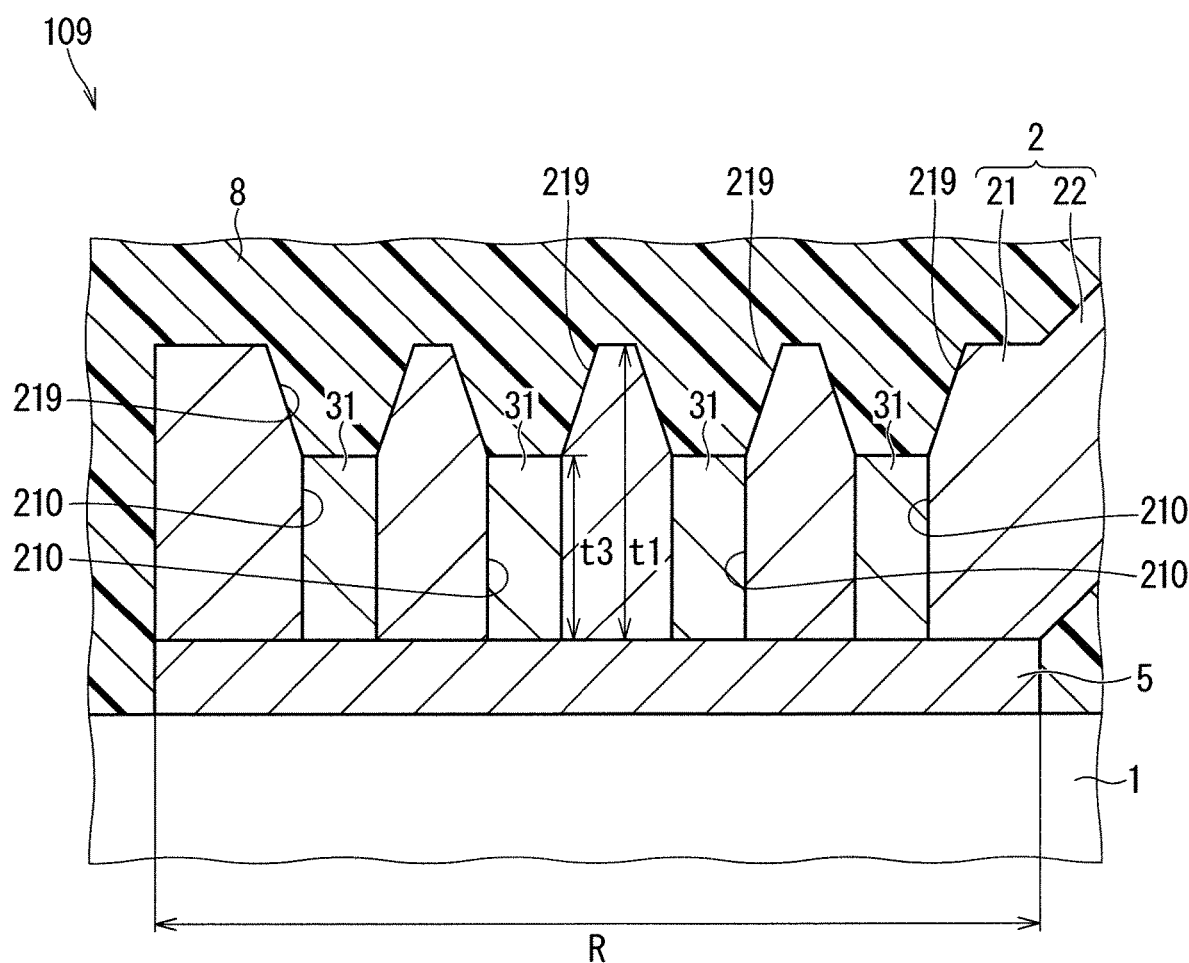
FIG. 16 A cross-sectional view illustrating a configuration of a semiconductor device according to Embodiment 9 of the invention.

FIG. 16 is a cross-sectional view illustrating a configuration of a semiconductor device 109 according to Embodiment 9 of the invention. FIG. 16 illustrates a cross section at a position where a plurality of holes 210 appear. In FIG. 16, the heat spreader 4 side (the side opposite to the lead frame 2) from the semiconductor element 1 is omitted.

The semiconductor device 109 differs from the semiconductor device 108 in that the thickness t3 of the solder 31 inside the hole 210 is thinner than the thickness t1 of the first portion 21. In other words, in the hole 210, no solder 31 exists on the surface of the first portion 21 on the side opposite to the semiconductor element 1. That is, no solder 31 exists in at least a part of the opening 219 on the side opposite to the semiconductor element 1.

Such a difference between the thicknesses t1 and t3 is advantageous in that the sealing resin 8 enters the hole 210.

The inclination of the inner wall of the opening 219 with respect to the thickness direction of the first portion 21 facilitates the sealing resin 8 to flow into the hole 210.

When the sealing resin 8 enters the holes 210, the contact area between the sealing resin 8 and the solder 31 is reduced, and the contact area between the sealing resin 8 and the lead frame 2 is increased. The characteristic of the contact area is advantageous from the viewpoint of suppressing the sealing resin 8 from peeling off from the lead frame 2. It is preferable that the lead frame 2 contains copper as a main component. This is because the adhesiveness between copper and the sealing resin 8 is higher than the adhesiveness between the solder 31 and the sealing resin 8.

Embodiment 10

Figure 17:
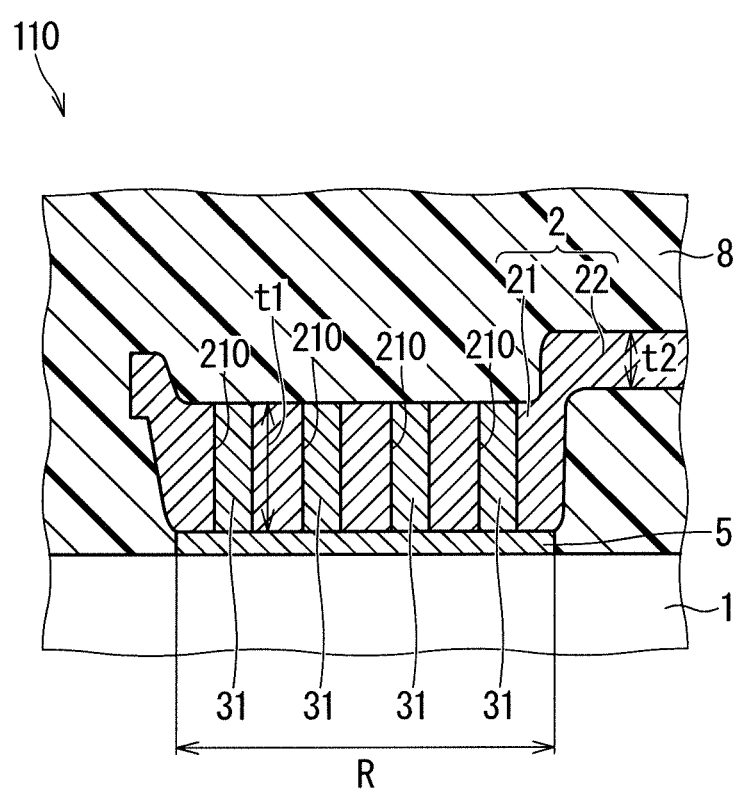
FIG. 17 A cross-sectional view illustrating a configuration of a semiconductor device according to Embodiment 10 of the invention.

FIG. 17 is a cross-sectional view illustrating a configuration of a semiconductor device 110 according to Embodiment 10 of the invention. FIG. 17 illustrates a cross section at a position where a plurality of holes 210 appear. In FIG. 17, the heat spreader 4 side (the side opposite to the lead frame 2) from the semiconductor element 1 is omitted.

The semiconductor device 110 differs from the semiconductor device 101 in that the thickness t1 of the first portion 21 is thicker than the thickness t2 of the second portion 22. Making the thickness t1 thicker is advantageous from the viewpoint of reducing the stress generated in the solder 31 by increasing the thickness of the solder 31. Making the thickness t2 thinner is advantageous from the viewpoint of facilitating the machining and bending of the lead frame 2 and the viewpoint of reduction in weight of the semiconductor device 110.

Therefore, making the thickness t1 larger than the thickness t2 is advantageous from the viewpoint that the thickness of the solder 31 is increased while facilitating the machining and bending of the lead frame 2, and the weight reduction of the semiconductor device 110 is not impaired.

Embodiment 11

Figure 18:
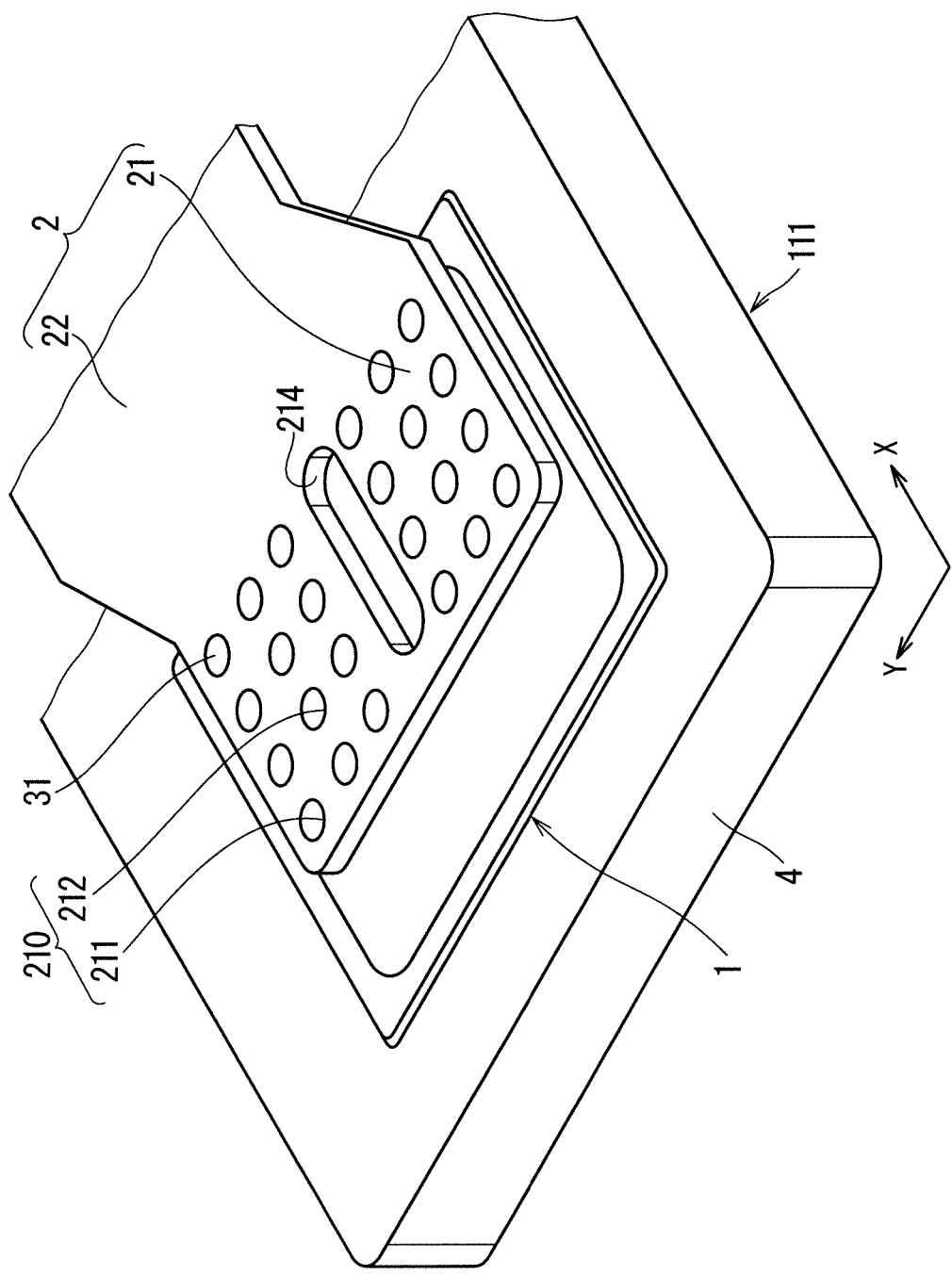
FIG. 18 A perspective view illustrating a configuration of a semiconductor device according to Embodiment 11 of the invention.

FIG. 18 is a perspective view illustrating a configuration of a semiconductor device 111 according to Embodiment 11 of the invention. The semiconductor device 111 has a configuration in which second holes 212 (see FIG. 4) are provided in regions surrounded by the regions 213h and 213i (see FIG. 12) in the semiconductor device 106.

Figure 19:
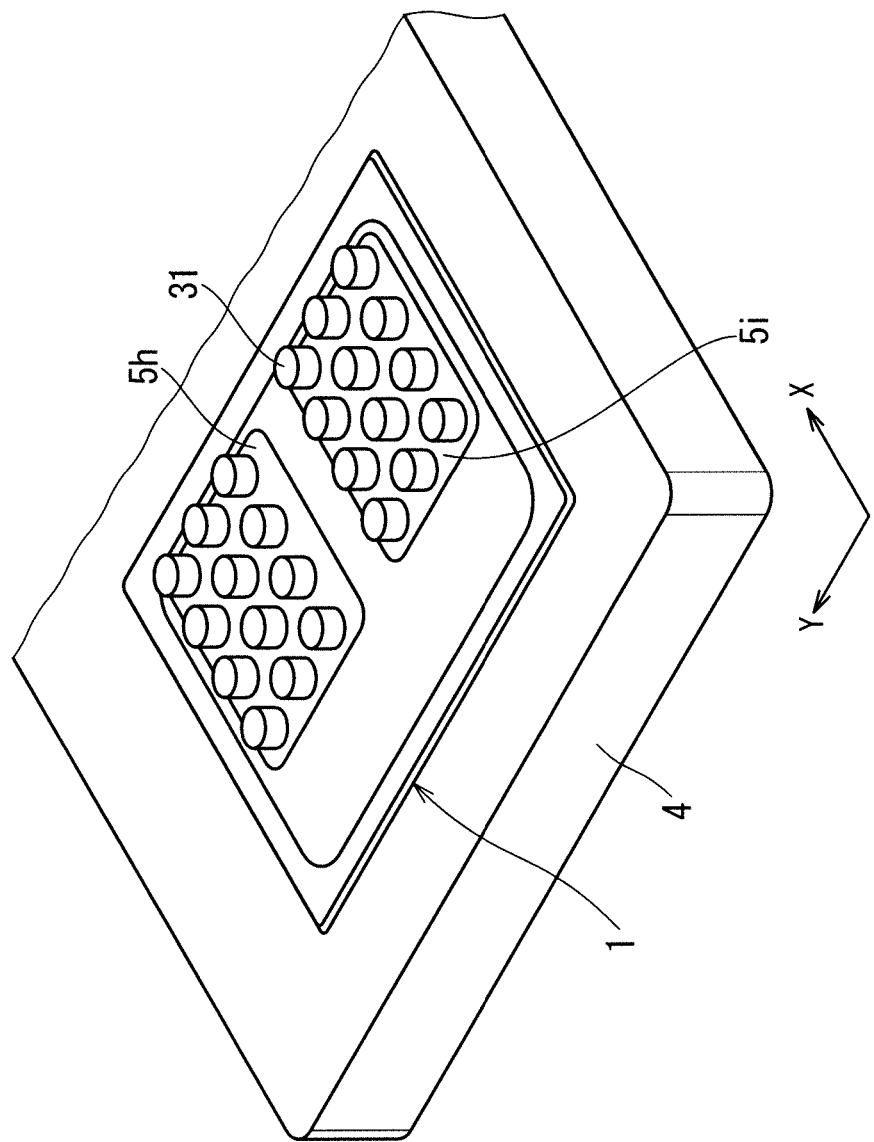
FIG. 19 A perspective view illustrating the configuration of the semiconductor device according to Embodiment 11 of the invention.
Figure 20:
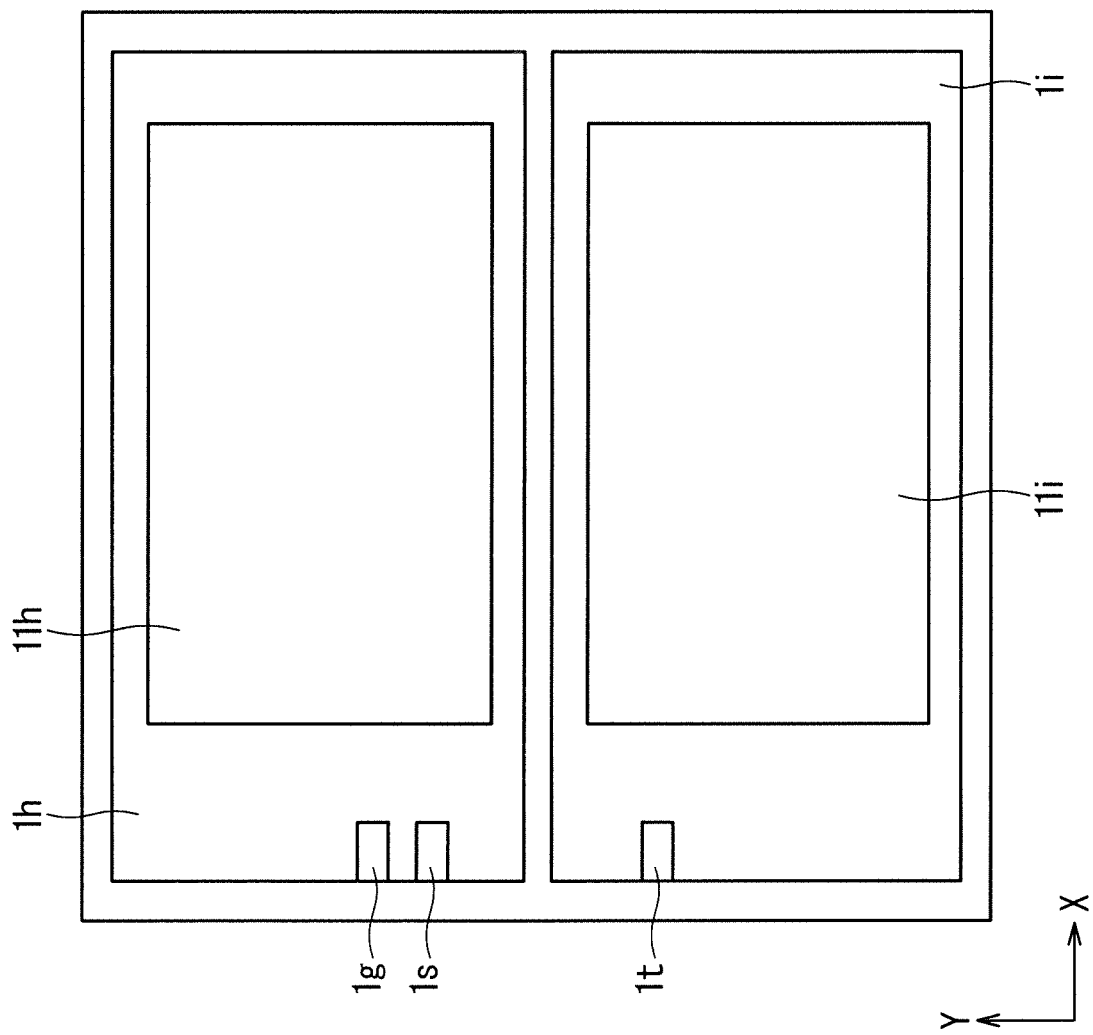
FIG. 20 A plan view illustrating a semiconductor element adopted by the semiconductor device according to Embodiment 11 of the invention.

FIG. 19 is a perspective view illustrating a part of the semiconductor device 111, specifically, the configuration in which the lead frame 2 is omitted. FIG. 20 is a plan view illustrating the semiconductor element 1 adopted in the semiconductor device 111. The configuration of the semiconductor element 1 can also be adopted as the configuration of the semiconductor element 1 in the semiconductor device 106 (see FIG. 12).

In FIGS. 18 and 19, for simplicity, the drawing of the emitter electrodes 1h and 1i, the gate electrode 1g, the signal electrodes 1s and 1t, and the front metal 11h and the front metal 11i is omitted. Bonding layers 5h and 5i corresponding to the bonding layer 5 of the semiconductor device 106 are illustrated in FIG. 19. The bonding layers 5h and 5i cover front metal 11h and front metal 11i (not shown). The bonding layers 5h and 5i are omitted in FIG. 18.

Through holes 214 are opened in the first portion 21 above the bonding layers 5h and 5i (on the side opposite to the semiconductor element 1 with respect to the bonding layers 5h and 5i). No solder material is provided in the through holes 214.

Figure 21:
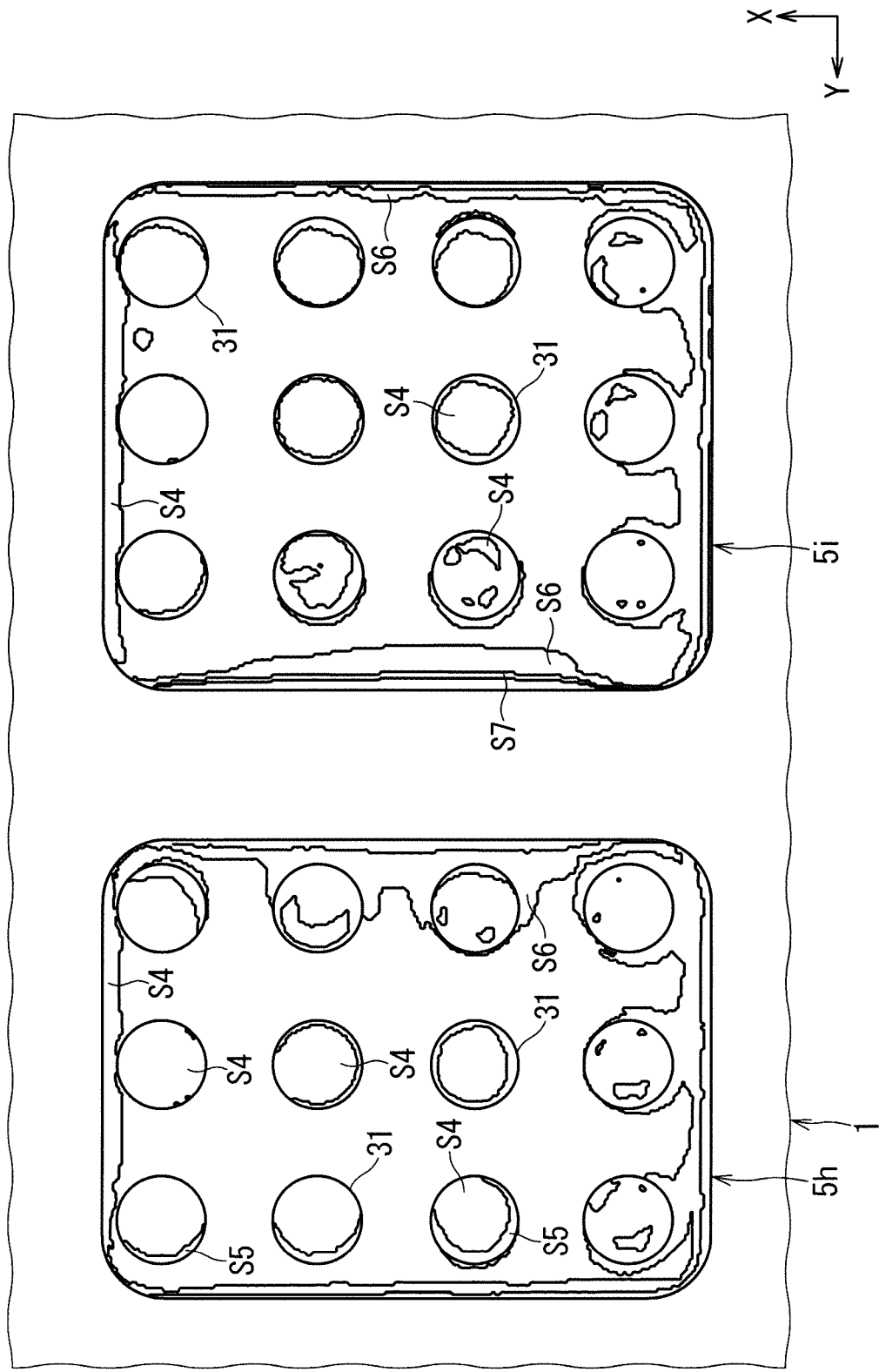
FIG. 21 A diagram illustrating stress distribution in the semiconductor device according to Embodiment 11 of the present invention.

FIG. 21 is a diagram illustrating stress distribution in the bonding layers 5h and 5i of the semiconductor device 111. In the drawing, the positions at which the stresses are equal are connected by lines (hereinafter referred to as "isobars"). The stress was obtained by heating the semiconductor element 1 with a temperature difference of 100° C. The isobar at the center of the three isobars does not always indicate the average of the stress values indicated by the pair of isobars that sandwich the isobar. The stress in each of the regions S4, S5, S6, and S7 is larger in this order.

The closer to the periphery of the bonding layer 5h, the larger the stress in the bonding layer 5h becomes and the same applies to the bonding layer 5i. Stress is small in the solder 31. This is consistent with the description in Embodiment 1.

Figure 22:
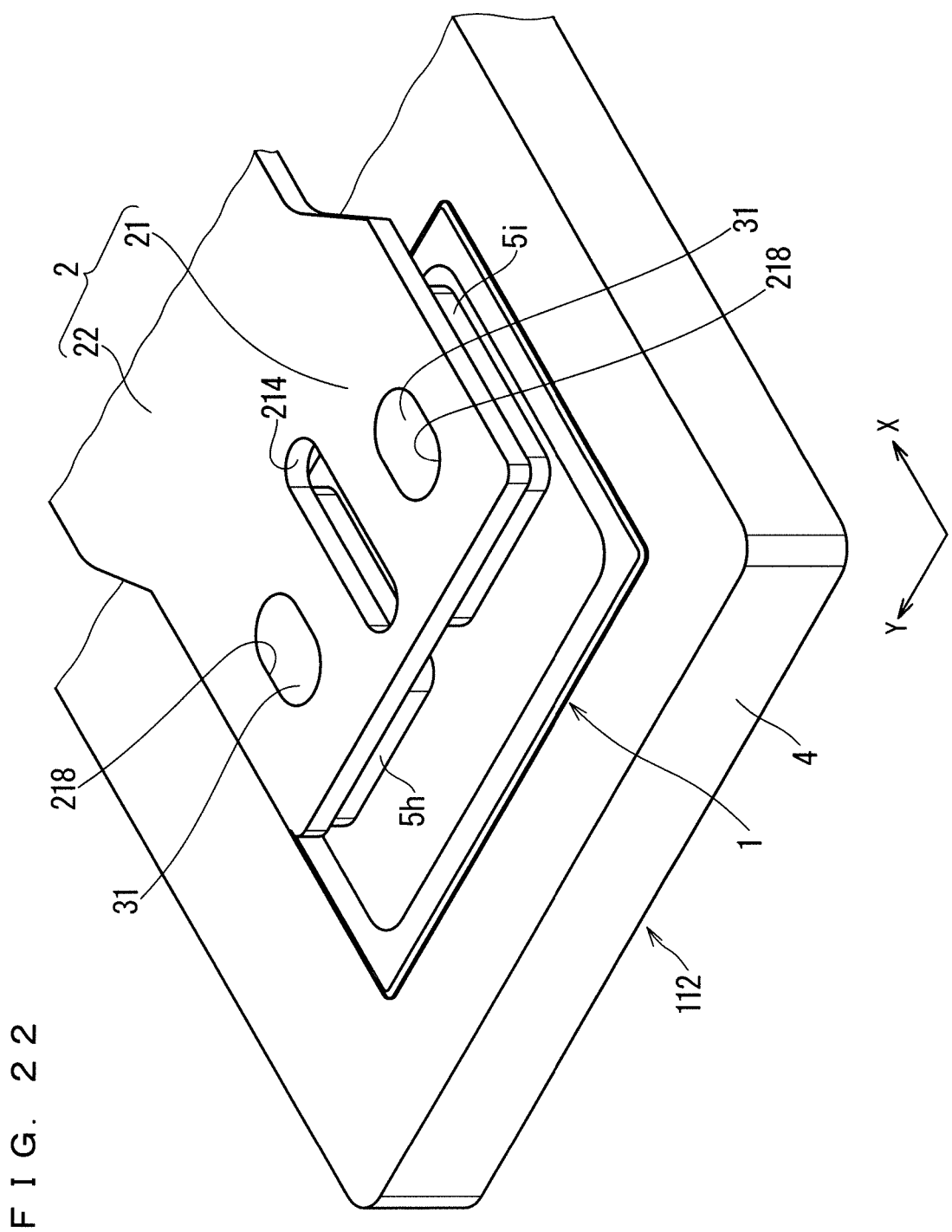
FIG. 22 A perspective view illustrating a configuration of a semiconductor device of a comparative example to the semiconductor device according to Embodiment 11 of the invention.
Figure 23:
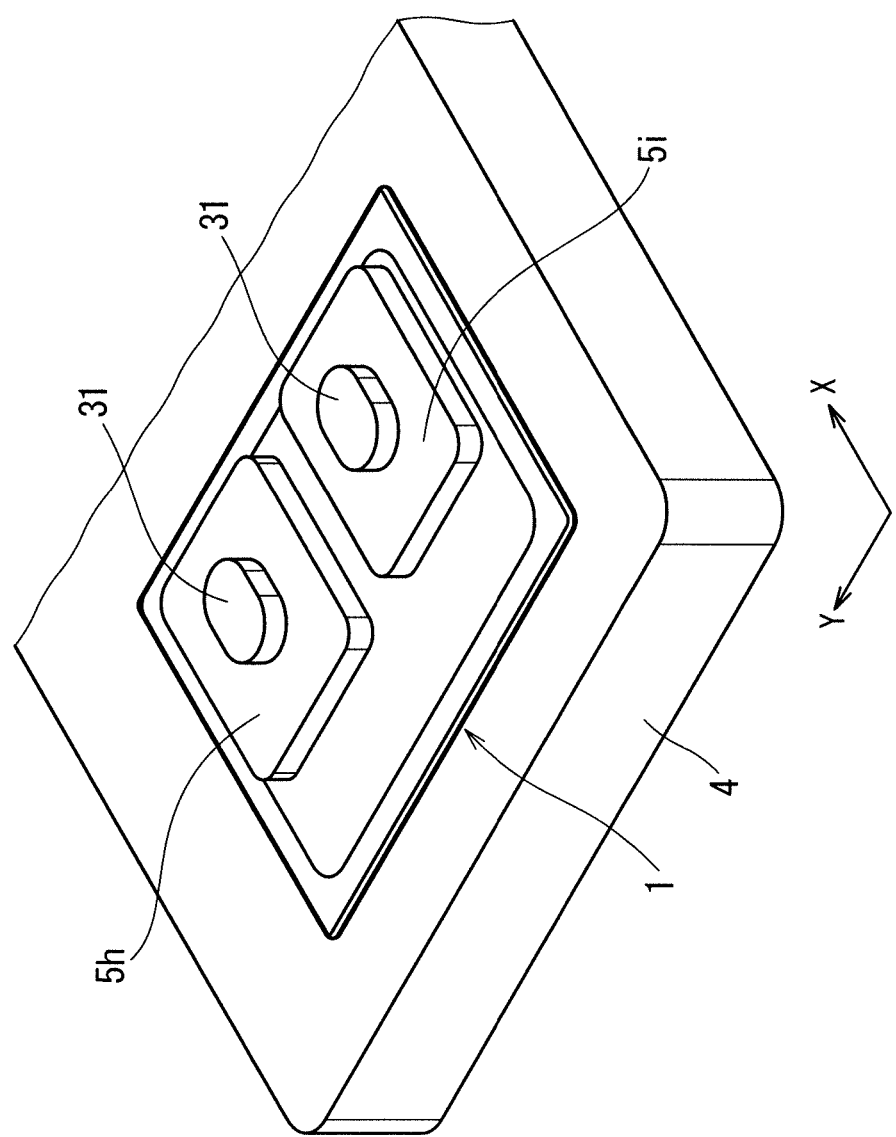
FIG. 23 A perspective view illustrating a configuration in which a part of the semiconductor device of the comparative example is omitted.

FIG. 22 is a perspective view illustrating a configuration of a semiconductor device 112 of a comparative example to the semiconductor device 111. FIG. 23 is a perspective view illustrating a part of the semiconductor device 112, specifically, the configuration in which the lead frame 2 is omitted. As is the same with the semiconductor device 111, the semiconductor device 112 also adopts the semiconductor element 1 illustrated in FIG. 20.

Instead of the plurality of holes 210 of the semiconductor device 111, in the semiconductor device 112, one through hole 218 for each of the front metal 11h and the front metal 11i is adopted. The through hole 218 is located substantially in the center of each of the front metal 11h and the front metal 11i. The solder 31 is provided in the through holes 218.

Figure 24:
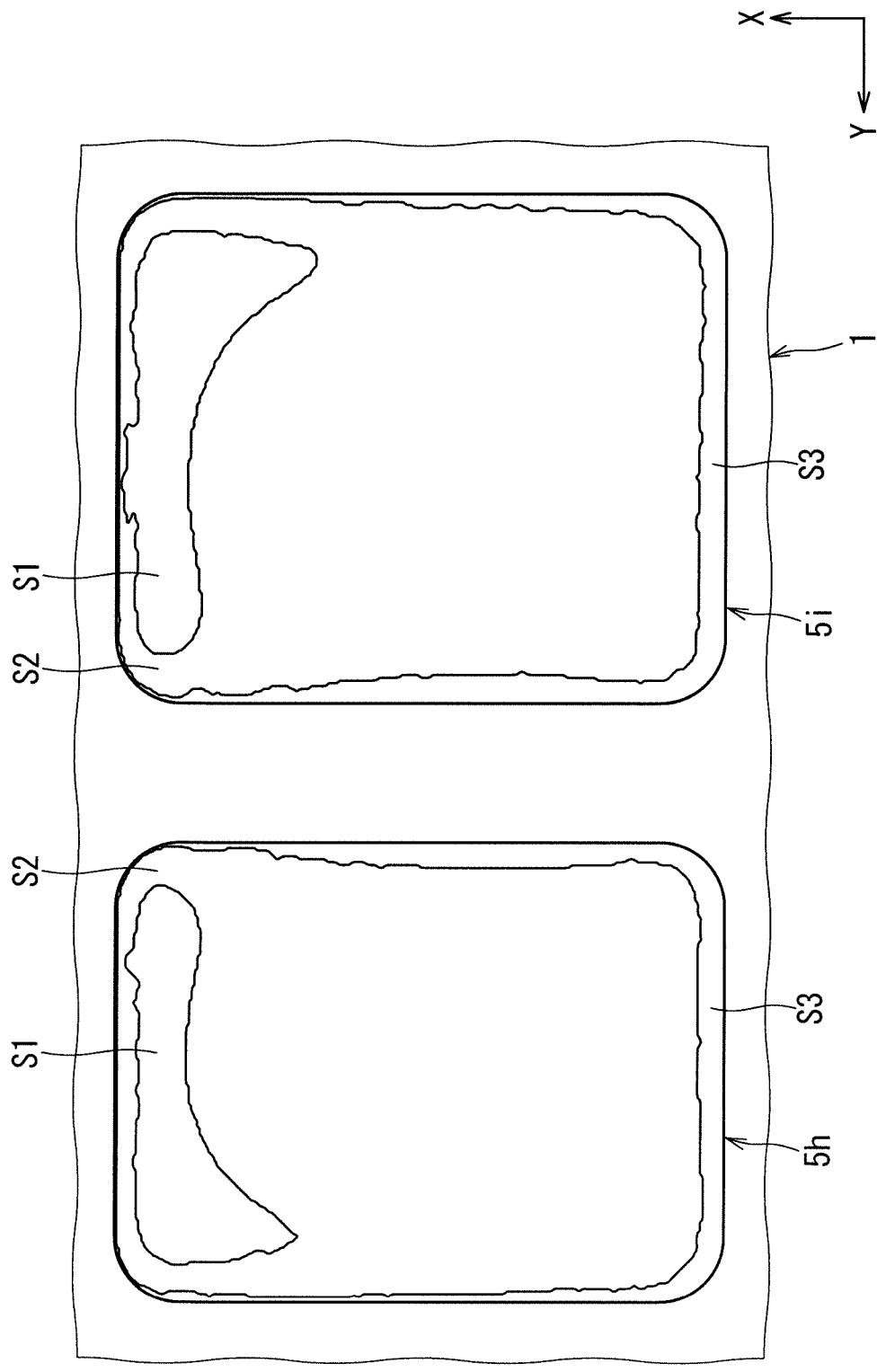
FIG. 24 A diagram illustrating stress distribution in the semiconductor device of the comparative example.

FIG. 24 is a diagram illustrating stress distribution in the bonding layers 5h and 5i of the semiconductor device 112. The stress was obtained by heating the semiconductor element 1 with a temperature difference of 100° C. The isobar at the center of the three isobars does not always indicate the average of the stress values indicated by the pair of isobars that sandwich the isobar. The stress in each of the regions S1, S2, and S3 is higher in this order.

As is the same with the stress distribution illustrated in FIG. 21, The closer to the periphery of the bonding layer 5h, the larger the stress in the bonding layer 5h becomes and the same applies to the bonding layer 5i in the stress distribution illustrated in FIG. 24. However, unlike the stress distribution illustrated in FIG. 21, the stress distribution illustrated in FIG. 24 does not reflect the shape of the solder 31. The reason for this is that it is considered that the bonding layers 5h and 5i in the semiconductor device 112 are thicker than the bonding layers 5h and 5i in the semiconductor device 111, and the distance between the semiconductor element 1 and the first portion 21 is larger. With such a stress distribution, the effect of suppressing the crack from growing toward the central portion of the emitter electrodes 1h and 1i is small.

<Modification>

For the semiconductor element 1 used in the semiconductor devices 101 to 111, not only is a semiconductor element (Si device) of which main material is Si (silicon) adoptable but a semiconductor element (SiC device) of which main material is SiC (silicon carbide) is also adoptable. SiC devices are advantageous in terms of lower loss than Si devices. The Young's modulus, which is a mechanical characteristic value, is about 170 GPa for Si devices and about 400 GPa for SiC devices. Therefore, SiC devices are less likely to follow the thermal deformation due to thermal cycles, as compared to Si devices. Therefore, the SiC device has higher shear stress generated in the semiconductor element 1 and the bonding layers 5, 5h, and 5i than that of the Si device. Merit in which crack generation is likely to occur in the bonding layers 5, 5h, and 5i, cracks are less likely to grow toward the semiconductor element 1, and a uniform life for the semiconductor devices 101 to 111 is ensured is more effectively exhibited in SiC devices than Si devices.

It should be noted that Embodiments of the present invention can be arbitrarily combined and can be appropriately modified or omitted without departing from the scope of the invention.

For example, in Embodiments 4 to 6, the emitter electrode 1e may have three or more plates of front metal.

For example, the protrusions 9 described in Embodiment 7 are adoptable in any of the semiconductor devices 102 to 106, 108 and 110.

For example, the openings 219 described in Embodiments 8 and 9 are adoptable in any of the semiconductor devices 102 to 107 and 110.

For example, the relationship between the thicknesses t1 and t2 described in Embodiment 10 are adoptable in any of the semiconductor devices 101 to 109.

While the invention has been described in detail, the forgoing description is in all aspects illustrative and not restrictive. It is understood that numerous other modifications and variations can be devised without departing from the scope of the invention.

EXPLANATION OF REFERENCE SIGNS 1 semiconductor element, 2 lead frame, 5 bonding layer, 9 protrusion, 11, 11f, 11g, 11h, 11i electrode, 21 first portion, 22 second portion, 31 solder, 51 first layer, 52 second layer, 101 to 111 semiconductor device, 210 hole, 211 first hole, 212 second hole, 213, 213f, 213g, 213h, 213i region, 219 opening.

The invention claimed is:

1. A semiconductor device comprising:
a semiconductor element including an electrode material of which is first metal;
a lead frame through which a plurality of holes extend with an outer contour of the electrode being avoided in a first portion, and including the first portion, material of which is second metal;
a bonding layer interposed between the first portion and the electrode; and
solder being inside the plurality of holes and adjoining the bonding layer, the solder being thicker than the bonding layer, wherein
the plurality of holes include a plurality of first holes extending through the first portion in a thickness direction of the first portion,
the bonding layer includes
a first bonding layer located on the electrode side and being an alloy of the first metal and tin, and
a second bonding layer located on the first portion side and being an alloy of the second metal and tin, and
the plurality of first holes are located in an annular region inside the outer contour of the electrode.

2. The semiconductor device according to claim 1, wherein
the plurality of holes further include a second hole surrounded by the annular region and extending through the first portion in the thickness direction.

3. The semiconductor device according to claim 1, wherein
the plurality of first holes have slit shapes elongated along the annular region.

4. The semiconductor device according to claim 1, wherein
a plurality of electrodes isolated from one another in parallel with the first portion are provided as the electrode, and
in each of the plurality of electrodes, the plurality of first holes are located in the annular region inside an outer contour of the lead frame.

5. The semiconductor device according to claim 4, wherein
the plurality of electrodes are aligned along a direction in which the lead frame extends.

6. The semiconductor device according to claim 4, wherein
the plurality of electrodes are aligned along in a direction different from the direction in which the lead frame extends.

7. The semiconductor device according to claim 1, further comprising
a plurality of protrusions interposed between the first portion and the semiconductor element.

8. The semiconductor device according to claim 1, wherein,
on a side opposite to the semiconductor element, the plurality of holes have openings whose diameters are wider as a distance from the semiconductor element increases.

9. The semiconductor device according to claim 8, wherein
a thickness of the solder inside of the plurality of holes is thinner than a thickness of the first portion.

10. The semiconductor device according to claim 1, wherein
the lead frame further includes a second portion connected to the first portion and being apart from the semiconductor element farther than the first portion, and
the thickness of the first portion is thicker than a thickness of the second portion.

* * * * *